US007790500B2

(12) United States Patent
Ramos et al.

(10) Patent No.: US 7,790,500 B2
(45) Date of Patent: Sep. 7, 2010

(54) PARTIALLY PATTERNED LEAD FRAMES AND METHODS OF MAKING AND USING THE SAME IN SEMICONDUCTOR PACKAGING

(75) Inventors: Mary Jean Ramos, Alessandrea (SG); Anang Subagio, Batam Island (ID); Lynn Simporios Guirit, Yishun (SG); Romarico Santos San Antonio, Bulacan (PH)

(73) Assignee: Unisem (Mauritius) Holdings Limited, Port Louis (MU)

( * ) Notice: Subject to any disclaimer, the term of this patent is extended or adjusted under 35 U.S.C. 154(b) by 261 days.

(21) Appl. No.: 11/877,732

(22) Filed: Oct. 24, 2007

(65) Prior Publication Data

US 2008/0258278 A1 Oct. 23, 2008

Related U.S. Application Data

(63) Continuation-in-part of application No. 11/553,664, filed on Oct. 27, 2006, which is a continuation-in-part of application No. 11/197,944, filed on Aug. 4, 2005, now Pat. No. 7,622,332, which is a continuation of application No. 10/916,093, filed on Aug. 10, 2004, now Pat. No. 7,129,116, which is a continuation of application No. 10/134,882, filed on Apr. 29, 2002, now Pat. No. 6,812,552.

(51) Int. Cl.
*H01L 21/00* (2006.01)
*H01L 23/495* (2006.01)
(52) U.S. Cl. ............... 438/106; 257/676; 257/E33.066; 257/E23.031; 257/E23.042
(58) Field of Classification Search ................ 438/106, 438/11, 123–127; 257/666, 672, 676–678, 257/E33.066, E23.031, E23.042
See application file for complete search history.

(56) References Cited

U.S. PATENT DOCUMENTS 4,038,488 A 7/1977 Lin (Continued)

FOREIGN PATENT DOCUMENTS

EP 977251 2/2000

(Continued)

OTHER PUBLICATIONS

"Surface Finishing for Lead Free", by George Milad, Uyemura International Corp., Southington, Connecticut, http://www.uyemura.com/library-4.htm.

(Continued)

*Primary Examiner*—Davienne Monbleau
*Assistant Examiner*—Monica D Harrison
(74) *Attorney, Agent, or Firm*—White & Case LLP

(57) ABSTRACT

A method of making a lead frame and a partially patterned lead frame package with near-chip scale packaging lead-count, wherein the method lends itself to better automation of the manufacturing line and improved quality and reliability of the packages produced therefrom. A major portion of the manufacturing process steps is performed with a partially patterned strip of metal formed into a web-like lead frame on one side so that the web-like lead frame is also rigid mechanically and robust thermally to perform without distortion or deformation during the chip-attach and wire bond processes, both at the chip level and the package level. The bottom side of the metal lead frame is patterned to isolate the chip-pad and the wire bond contacts only after the front side, including the chip and wires, is hermetically sealed with an encapsulant. The resultant package being electrically isolated enables strip testing and reliable singulation.

19 Claims, 24 Drawing Sheets

U.S. PATENT DOCUMENTS

| | | | |
|---|---|---|---|
| 4,368,168 A | 1/1983 | Slepcevic |
| 5,656,550 A | 8/1997 | Tsuji et al. |
| 5,703,407 A | 12/1997 | Hori |
| 5,767,574 A | 6/1998 | Kim et al. |
| 5,847,458 A | 12/1998 | Nakamura et al. |
| 5,896,651 A | 4/1999 | Hawthorne |
| 5,936,303 A | 8/1999 | Nishi |
| 6,001,671 A | 12/1999 | Fjelstad |
| 6,054,755 A | 4/2000 | Takamichi et al. |
| 6,093,584 A | 7/2000 | Fjelstad |
| 6,143,981 A | 11/2000 | Glenn |
| 6,232,650 B1 | 5/2001 | Fujisawa et al. |
| 6,238,952 B1 | 5/2001 | Lin |
| 6,291,274 B1 | 9/2001 | Oida et al. |
| 6,294,830 B1 | 9/2001 | Fjelstad |
| 6,316,727 B1 | 11/2001 | Liu |
| 6,348,399 B1 | 2/2002 | Lin |
| 6,355,199 B1 | 3/2002 | Briar et al. |
| 6,373,140 B1 | 4/2002 | Onodera et al. |
| 6,451,627 B1 | 9/2002 | Coffman |
| 6,498,099 B1 | 12/2002 | McLellan et al. |
| 6,534,849 B1 | 3/2003 | Gang |
| 6,545,364 B2 | 4/2003 | Sakamoto et al. |
| 6,576,539 B1 | 6/2003 | Lin |
| 6,585,905 B1 | 7/2003 | Fan et al. |
| 6,635,957 B2 | 10/2003 | Kwan et al. |
| 6,657,293 B1 | 12/2003 | Fumihira |
| 6,798,121 B2 | 9/2004 | Nakatani et al. |
| 6,821,821 B2 | 11/2004 | Fjelstad |
| 6,856,235 B2 | 2/2005 | Fjelstad |
| 6,872,661 B1 | 3/2005 | Kwan et al. |
| 6,906,423 B1 | 6/2005 | Asakawa et al. |
| 6,933,594 B2 | 8/2005 | McLellan et al. |
| 6,989,294 B1 | 1/2006 | McLellan et al. |
| 6,995,460 B1 | 2/2006 | McLellan et al. |
| 7,144,800 B2 | 12/2006 | Mostafazadeh et al. |
| 7,342,303 B1 | 3/2008 | Berry et al. |
| 7,451,539 B2 | 11/2008 | Morris et al. |
| 7,576,415 B2 | 8/2009 | Cha et al. |
| 2001/0020546 A1 | 9/2001 | Eldridge et al. |
| 2001/0045625 A1 | 11/2001 | Sakamoto et al. |
| 2001/0045640 A1 | 11/2001 | Oida et al. |
| 2001/0050370 A1 | 12/2001 | Sakamoto et al. |
| 2001/0052600 A1 | 12/2001 | Sakamoto et al. |
| 2002/0027010 A1 | 3/2002 | Glenn |
| 2002/0041019 A1 | 4/2002 | Gang |
| 2002/0053745 A1 | 5/2002 | Lin |
| 2002/0089053 A1 | 7/2002 | Liu et al. |
| 2002/0105069 A1 | 8/2002 | Kawahara et al. |
| 2002/0159242 A1 | 10/2002 | Nakatani et al. |
| 2003/0127711 A1 | 7/2003 | Kawai |
| 2003/0170922 A1 | 9/2003 | Sakamoto et al. |
| 2009/0230523 A1 | 9/2009 | Chien et al. |

FOREIGN PATENT DOCUMENTS

| | | |
|---|---|---|
| EP | 1162669 | 12/2001 |
| EP | 1189272 | 3/2002 |
| JP | 11-186294 | 7/1999 |
| JP | 11-195742 | 10/1999 |
| JP | 2000-150760 | 5/2000 |
| JP | 2000-188309 | 7/2000 |
| JP | 2001-127199 | 5/2001 |
| JP | 2002-76245 | 3/2002 |
| JP | 2002-76246 | 3/2002 |
| KR | 2001-0008926 | 2/2001 |
| TW | 464053 | 11/2001 |
| WO | WO-2003-103038 | 12/2003 |
| WO | WO-2004-064144 | 7/2004 |
| WO | WO-2004-030030 | 8/2004 |
| WO | WO-2008-057770 | 5/2008 |

OTHER PUBLICATIONS

"Immersion tin: Its chemistry, metallurgy, and application in electronic packaging technology", by Kovac et al., IBM J. Res. Develop., vol. 28, No. 6 (Nov. 1984), 726 (Abstract).

International Search Report dated Apr. 22, 2008 cited in International Application No. PCT/US2007/082423.

Written Opinion dated Apr. 22, 2008 cited in International Application No. PCT/US2007/082423.

International Preliminary Report on Patentability for PCT/US2007/082423, issued Apr. 28, 2009.

International Search Report for PCT/IB03/04632, mailed Mar. 3, 2004.

Written Opinion for PCT/IB03/04632, mailed Jun. 6, 2004.

International Preliminary Examination Report for PCT/IB03/04632, completed Dec. 15, 2004.

International Search Report for PCT/US03/13046, mailed Sep. 23, 2003.

Written Opinion for PCT/US03/13046, mailed Feb. 25, 2004.

International Preliminary Examination Report for PCT/US03/13046, completed May 27, 2004.

International Search Report for PCT/GB04/00123, mailed Sep. 30, 2004.

Written Opinion for PCT/GB04/00123, mailed Sep. 30, 2004.

International Preliminary Examination Report for PCT/GB04/00123, completed Jan. 20, 2005.

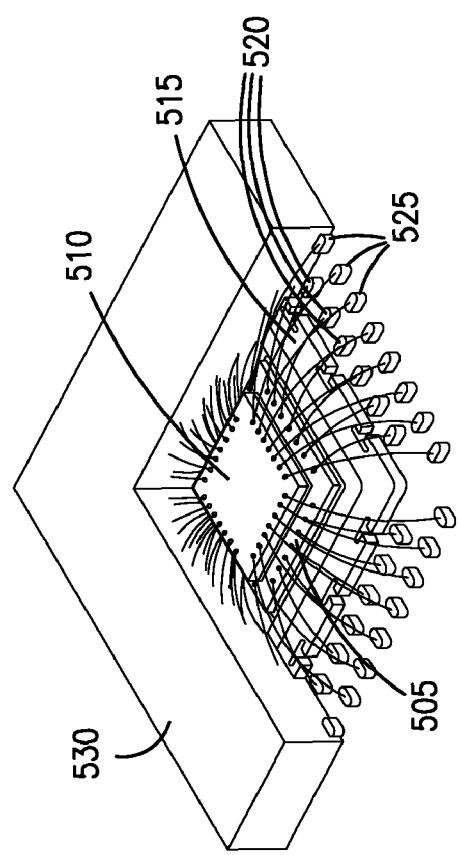
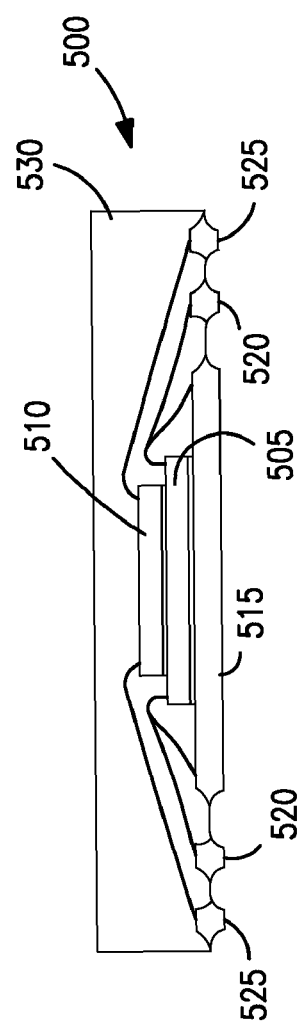
FIG. 26A
FIG. 26B

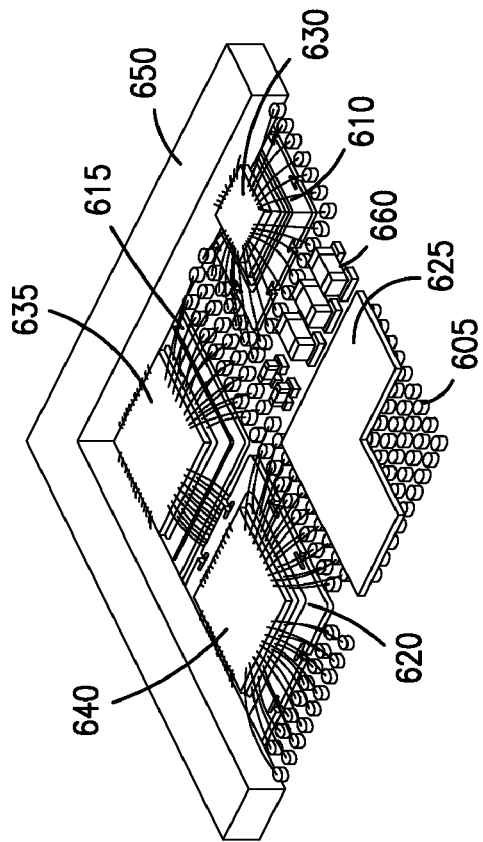
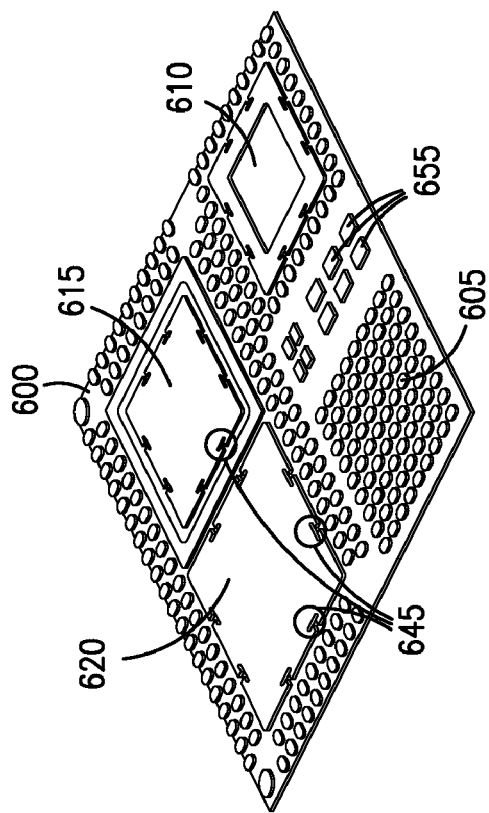
FIG. 28B
FIG. 28A

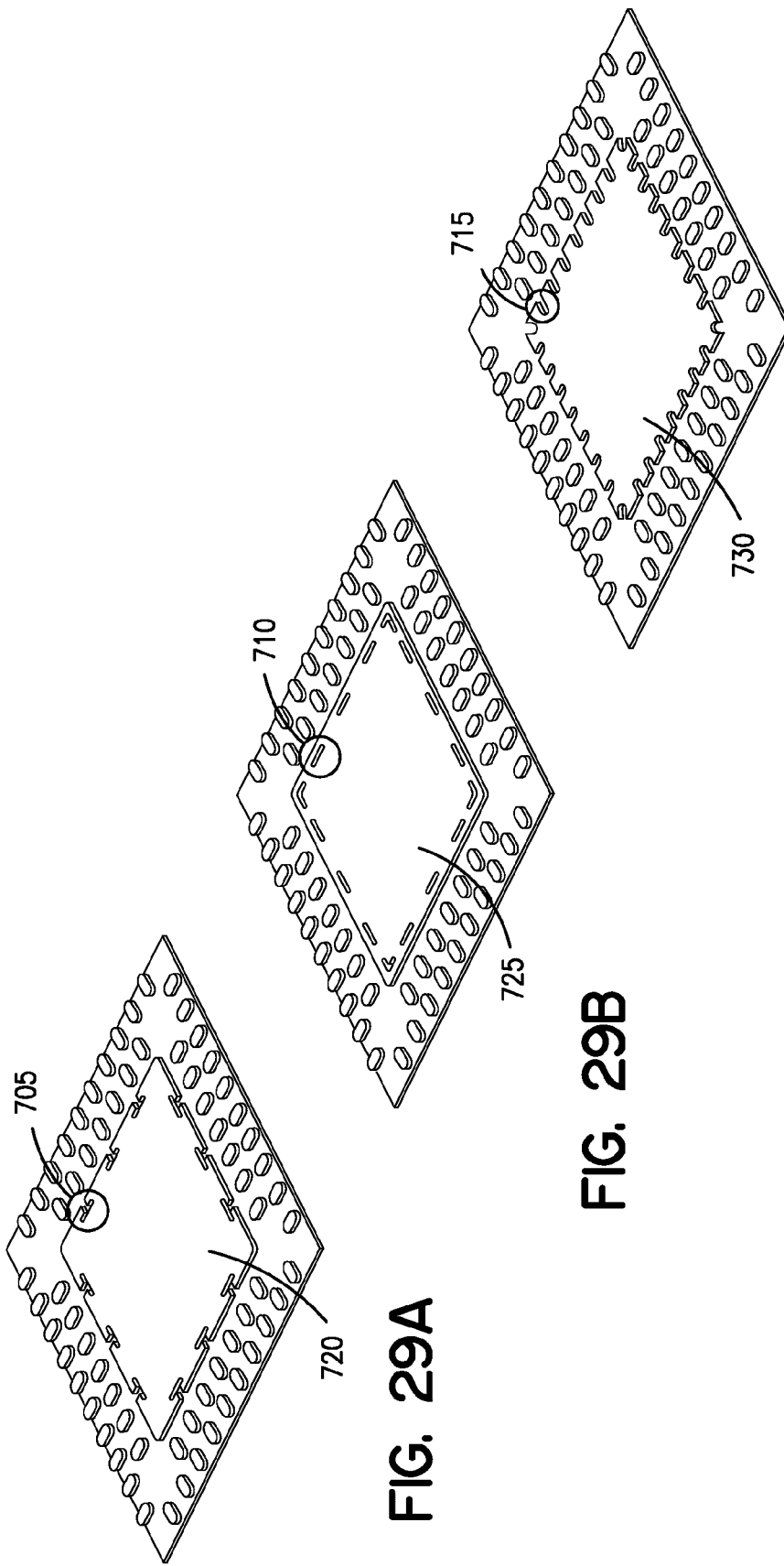

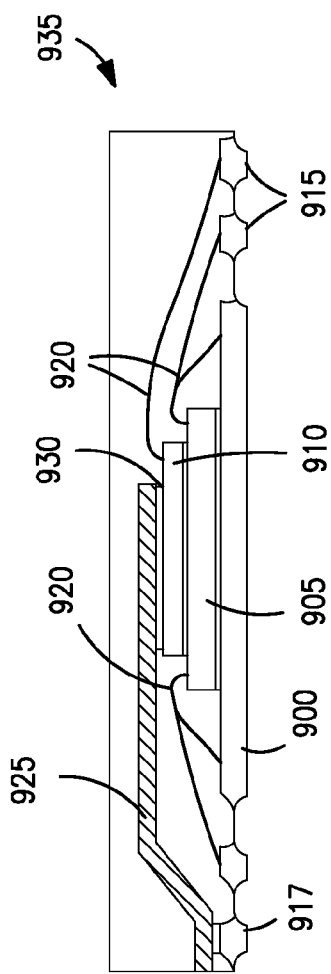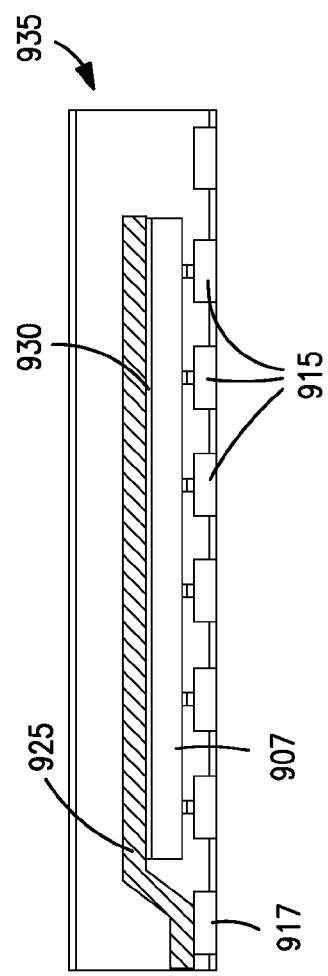
FIG. 33A
FIG. 33B

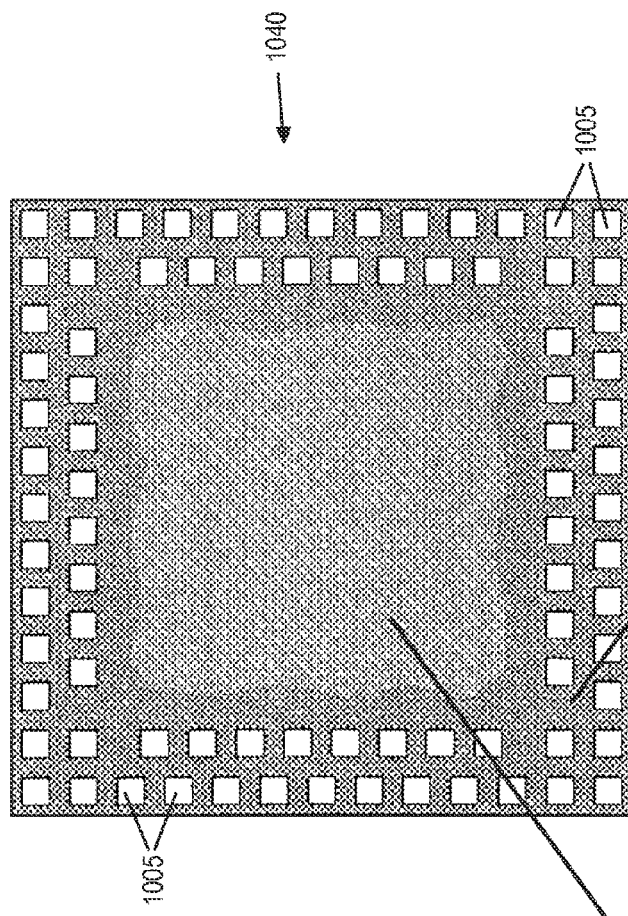
FIG. 35
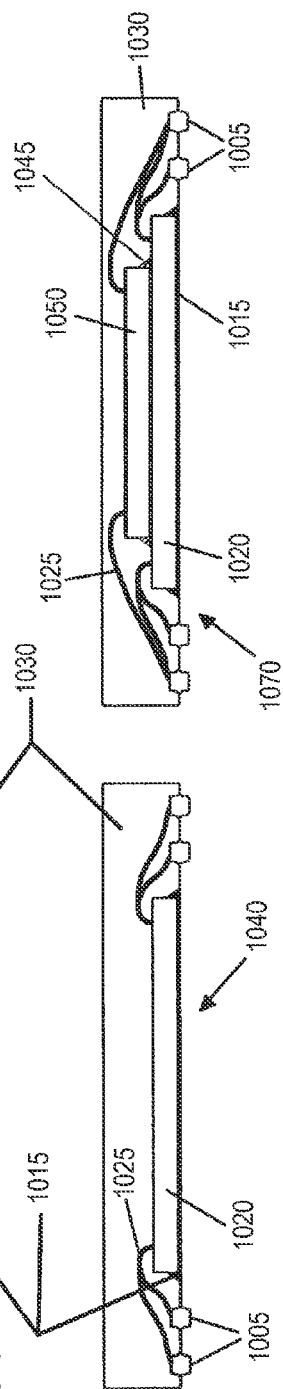
FIG. 36A
FIG. 36B

PARTIALLY PATTERNED LEAD FRAMES AND METHODS OF MAKING AND USING THE SAME IN SEMICONDUCTOR PACKAGING

FIELD OF THE INVENTION

This application is a continuation-in-part of application Ser. No. 11/553,664, filed Oct. 27, 2006, which is a continuation-in-part of application Ser. No. 11/197,944, filed Aug. 4, 2005 now U.S. Pat. No. 7,622,332, which is a continuation of application Ser. No. 10/916,093, filed Aug. 10, 2004, now U.S. Pat. No. 7,129,116, which is a continuation of application Ser. No. 10/134,882, filed Apr. 29, 2002, now U.S. Pat. No. 6,812,552. All of these applications are incorporated herein by reference in their entirety.

The invention relates to electronic packaging in general, and more particularly, to a partially patterned lead frame and a method for making and using the same. The partially patterned lead frame is stronger and more stable than conventional lead frames. The sturdiness of the partially patterned lead frame improves the process of manufacturing lead frame packages and enhances the overall reliability of the end product. The lead frame also offers a high degree of flexibility for device integration and increased functionality.

BACKGROUND OF THE INVENTION

In making electronic packages that use lead frames, there are several process steps that subject the lead frames to mechanical and thermal stresses. The finer geometries of current lead frames and the ever-increasing integration of circuits on semiconductor chips have resulted in processing that places even greater stress on the lead frames. Finely configured lead frames often resemble very delicate embroidery, or stencil-like metal structures that tend to bend, break, disfigure and deform easily. (See FIGS. 1a and 1b). Such conventional lead frames are used in the industry to create a variety of chip packages, including wire bonded and flip-chip (FC) packages. (See FIGS. 2a-2d and 3a-3b).

Conventional lead frames generally lack structural rigidity. The finger-like portions of lead frames can be quite flimsy and difficult to hold in position. This leads to handling flaws, damage and distortion in assembly processes and complicated wire bonding situations. Consequently, bond parameters have to be optimized to compensate for lead frame bouncing during the bonding process. A failure to optimize the bonding parameters to compensate for the mechanical instability of the lead frame can result in poor bond adhesion, and hence poor quality and poor reliability of the bond.

The large metal plate portions of a typical lead frame extend from a central portion, known as the chip receiving area, also known as a chip-pad. The chip is usually attached to the receiving area with the backside down, and the front side is positioned face up with terminals located peripherally on the perimeter of the chip, or over the surface of the chip in the form of an array. The receiving area typically has dimensions of about 5 mm×5 mm, and the leads extending outwardly from the chip-pad area have typical dimensions of about 10 mm long×1 mm wide×0.2 mm thick. The lead frame is typically held down by a vacuum chuck and mechanical clamps. The chuck and clamps must be refitted for lead frames of different sizes and shapes. The present invention alleviates this problem.

The prior art has not shown any lead frames that can withstand the stresses encountered in current semiconductor packaging processes and that can be manufactures in a cost effective manner. The present invention achieves this objective by providing a partially patterned lead frame that not only improves the manufacturability of the lead frame itself, but also improves the integrity and reliability of the electronic packages that are formed therefrom. The present invention also addresses a continued need for increased device complexity, such as high I/O counts, multi-chip design, system in package, and flexibility on routing, that conventional lead frames are unable to offer.

SUMMARY OF THE INVENTION

The lead frame is composed of a film having a top surface and a bottom surface. A first region of the film is partially patterned from the top surface but not entirely through the film to the bottom surface. A second region of the film, not patterned from the top surface, forms a chip receiving area for supporting an integrated circuit (IC) chip and a plurality of lead contacts for providing electrical connections to the IC chip. The first region forms trenches in the film and creates a webbed structure that interconnects the second region that is not partially patterned from the top surface. The present invention is also directed to a method of manufacturing partially patterned lead frames and to electronic packages made utilizing the lead frames. The lead frame of the invention has improved structural rigidity because of its web-like, or webbed structure.

According to the invention, the top surface of a metal film, from which the lead frame is to be formed, is first patterned using standard photolithographic techniques or similar techniques to outline the areas that will correspond to a chip receiving area and leads. At the next step, etching is performed in the first region of the film outside the outlined areas from the top surface of the film partially through the thickness of the underlying film to create a lead frame pattern in the film. After the partial patterning, the remaining areas not patterned from the top surface form a second region, which will serve as a chip receiving area and leads along the top surface. The first region forms a recessed webbed region below the top surface of the film. The webbed structure of the first region connects the lead portions to each other and to the chip receiving area. Thus, the partially patterned film looks similar to a webbed foot and retains its rigidity and strength so it can withstand the forces of subsequent manufacturing process steps. In particular, the partially patterned lead frame can withstand the forces encountered during wire bonding and encapsulation processes. In some embodiments, the chip receiving area and electrical leads can be formed from the same parts of the second region (e.g., in the case where the electrical leads support the integrated chip as well as provide electrical connection thereto).

The present invention also provides a unique method of making a plurality of electronic packages using partially patterned lead frames. The method involves a film having a top surface and a bottom surface. In the first region, the film is partially patterned from the top surface but not entirely through to the bottom surface. The remaining second region on the film not partially patterned from the top surface forms a plurality of partially patterned lead frames. Each of the lead frames so has a chip receiving area for supporting an integrated circuit (IC) chip and a plurality of electrical leads for providing electrical connections to the IC chip.

The first region of the film forms a webbed structure that interconnects the chip receiving areas and electrical leads of each lead frame. The first region also connects the plurality of lead frames to one another in street portions of the film.

A plurality of chips is provided, each chip having a plurality of electrical terminals for attachment to a corresponding lead frame. Each chip is attached to the chip receiving area on a corresponding lead frame and an electrical connection is formed between at least one terminal of each chip and one of the electrical leads of the lead frame. Thereafter, an encapsulate material is applied over the lead frames and the street portions of the film to completely cover the top of the film. Once the encapsulate material is dried, a back patterning process is performed from the bottom surface of the film in the first region to remove the webbed structure and the street portions of the film. The encapsulate material disposed over the street portions of the film is then singulated to form individual packages.

In a preferred embodiment, the method includes forming the lead frames into the film in a matrix in a block/window pattern, and involves the production of chip scale packages.

Several advantages arise from the partially patterned lead frame of the present invention. The flat and solid un-etched bottom surface of the lead frame serves as an excellent heat sink during the wire bonding process. This provides even heat transfer for better and more consistent bond quality. Additionally, the solid structure provides a continuous surface for a universal vacuum chuck to hold the lead frame down, thereby making the chip-attachment process more stable and the leads more secure during the subsequent process steps. Awkward clamping of outer edges of the lead frame is eliminated to allow an array-matrix lead frame design and processing without conversion needs. Because the bottom side of the partially patterned lead frame is a flat continuous surface, a universal vacuum chuck may be used to hold down many different sizes of frames. This removes the complication of having to refit the vacuum chuck each time a lead frame of different dimensions is being employed in the packaging process. Also, there is no further need for clamping. The use of a universal vacuum chuck and elimination of clamping enables construction of dual or triple rows of staggered leads on the second region for higher lead counts.

The present invention is directed to a partially patterned lead frame that will accommodate not only wire-bonded chips but also solder bumped flip-chips. In addition, the invention teaches methods of using the partially patterned lead frame for making etched lead frame packages (ELPs) that use wire-bonding, ELPs with flip-chips (ELPFs), and also ELPs or ELPFs with land grid array (LGA) pads to form etched land grid array (ELGA) packages, as further described in the embodiments of the present invention.

Flip Chip (FC) technology is one more step towards fully automated joining of the electrical terminals on a chip to the next level of packaging, namely, to a ceramic or plastic substrate, or to a chip microcarrier that is later joined to the substrate. The microcarrier, which is only slightly larger than the chip itself, is now called the chip scale package (CSP). FC technology evolved from tape automated bonding (TAB) which in turn had its origins in wire bonding (WB). Whereas in WB and TAB the chip is positioned on its back surface and electrical connections are made to the terminals located around the perimeter on its top surface, in FC technology the orientation of the chip is reversed. The chip is placed face downward and the backside of the chip oriented upward. This flip-chip orientation has a significant advantage in that it concentrates the electrical functions on the underside of the chip, leaving the topside free for use in developing a highly efficient heat transfer design.

In the FC process, the chip terminals or bond pads are sealed with different types of bumps over the surface of the chip, where the patterns may be deployed in an area array, peripheral patterns or other patterns. The chip may be attached to the next level in the following ways: a) FC attachment to a lead frame; b) FC attachment of a layer/substrate, known as an interposer, for re-routing the connection spacing on a lead frame; c) FC attachment to a pre-attached interposer on a lead frame; or d) FC attachment to a printed circuit board using conventional techniques, including chip reflow methods.

Chip attachment using conventional techniques becomes especially difficult when applied to QFN (Quad Flat No Lead) lead frames in making QFN packages and derivatives thereof, such as VFQPF-N. This is because conventional lead frames in general lack structural rigidity. Finger-like portions of lead frames can be quite flimsy and difficult to hold in one precise position. This lends to handling flaws, damage and distortion in assembly processes and complicated chip bonding situations. PC joining processes require precise alignment of bumped solder heads against the hanging and flimsy lead ends of the lead frame. Furthermore, the wetted solder ends must retain their positions after placement through the solder reflow process. Consequently, reflow parameters have to be optimized to compensate for lead frame bouncing during chip joining, which, if not properly done, can result in poor joints, and hence poor quality and poor reliability of the end product.

It is common practice to form the conventional stencil-like lead frames by patterning a photo resist on a strip of metal, or metal film, and etching through the pattern to form the finger-like leads extending outwardly from the chip receiving area. It is also customary to use "tie-bars" between the fingers so that the fingers are kept apart during the various process steps, as was shown in FIGS. 3a and 3b. The present invention alleviates the problem of the lack of structural rigidity of the lead frame by forming a web-like, partially patterned lead frame instead of a stencil-like lead frame.

In accordance with a method of the present invention, all the major process steps of forming a semiconductor package are performed from one side of the film that is to become a lead frame. The other side, namely, the bottom side, remains flat and untouched on a surface, such as the surface of a vacuum chuck. This includes the step of encapsulating and hermetically sealing the partially formed front side of the package. Once the encapsulation is completed, the bottom surface is back-etched to remove selectively the webbed portions that connect the leads to each other and to the chip receiving area. In the ELP case, where the chip is back-bonded to a chip-pad at the chip receiving area and the electrical connection to the chip terminals is made by means of wire bonding, all intermediate webbed portions are severed through etching so that the chip-pad and the lead contacts at the wire bonded end are now isolated from each other by the molding material that surrounds the chip, the wires and the front surfaces of the wire-bonded contact areas. In the case of the ELPF package, however, only the webbed portions that connect the leads to each other are severed through etching, since leads themselves that are connected to the chip solder headed bumps provide the electrical connection to the next level of packaging.

The removal of embedded metal through the saw thickness, or streets, in the webbed portions has several advantages, including the elimination of the saw forces propagating throughout the lead frame structure, and hence, the prevention of the delamination at the metal-plastic interfaces. Also, the electrical isolation through back-etching enables strip testing prior to any sawing or singulation, or for that matter, prior to any further processing steps. After the back patterning, the remaining and exposed metal portions on the bottom surface can then be flash finished with any number of solderable materials through immersion-tin dipping or electroless-nickel plating. The ELGA package uses the PC of the ELPF package, however, with LGA pads for connection to the next level of packaging.

In order to prevent any separation between the molding material and other components of the package during manufacturing, the present invention also teaches how to form locking features on the exposed vertical walls of the recessed webbed portions of the partially etched lead frame, such as on the side walls of the leads, that will come in contact with the molding material, such as a resin. As an alternative, it is also taught to form "lips" on the edges of the chip-pad and lead contacts so as to capture the molding material under each lip, thereby making it difficult for the molding material to separate from the mating surfaces.

It will be apparent from the foregoing that the partially etched lead frame provides the unity of structure and the attendant rigidity and strength to withstand well the stress and strain of various manufacturing processes in the making of electronic packages. It is because of these unique mechanical properties that a partially etched lead frame package can also withstand the rigors of ultrasonic bonding of wires to the bottom of the package for connection to the next level of packaging, which heretofore, has not been possible with conventional plastic packages.

In another embodiment of the present invention, a method of forming electronic packages having ultrasonic bonded wires is. A block of partially etched lead frames is formed, wherein the lead frames, comprising webbed portions and separated from each other by street portions, have a continuous bottom surface. Chips are attached to chip receiving areas on the lead frames. Electrical connections are made between terminals of each chip and electrical lead portions of the corresponding lead frame. Wires are bonded ultrasonically to the bottom surface of the lead frames. Lead frames are encapsulated by applying an encapsulate material over the lead frames, including the street portions separating the lead frames. Back patterning of the bottom surface is next performed to remove the webbed portions and the street portions. Encapsulated lead frames are then singulated over the street portions to form individual chip scale packages having ultrasonically bonded wires on the bottom surface.

One embodiment of the present invention provides a method of forming chip scale packages. The method comprises forming a block of partially etched lead frames, the lead frames comprising webbed portions, a chip mounting area, a plurality of electrical lead portions, and street portions. An integrated circuit chip is attached to the chip mounting area of the first region of the film. Electrical connections are then formed between one or more terminals on the chip and one or more electrical lead portions on the lead frame. The lead frames are then encapsulated by applying an encapsulate material over the lead frames and street portions. The bottom surface of the lead frames is then back-etched to remove the webbed portions, street portions, and the chip mounting area, whereby all or a substantial portion of the lead frame underlying the integrated circuit chip is removed. The encapsulate material disposed over the street portions of the lead frame is then singulated to form individual chip scale packages. Any number of chips of any type may be affixed to the partially patterned lead frames.

The lead frames may be selectively pre-plated with a pre-plating material, or they may be masked with a masking material on their top side, bottom side, or both, prior to encapsulation.

The lead frames may be selectively pre-plated using any convenient or conventional substance. Examples of such substances include Ni/Pd/Au-strike, immersion-Ag, Sn/Pb, lead-free solder, immersion-tin electroless nickel, silver (Ag), and Au (gold) strike.

The lead frames may also be selectively masked using any convenient or conventional masking substance, such as a printable ink, a stenciling ink, an epoxy ink, or an organic substance.

The pre-plating material or the masking material may be removed from the bottom of the lead frames at any suitable time, such as after back-patterning.

The lead frame may be formed of any suitable substance known in the art. For example, the lead frame may comprises a film of copper or a copper alloy, or another metal or metal alloy.

As previously stated, an integrated circuit chip is attached to the chip mounting area of the lead frame. The chip may be attached using an adhesive or other tactile or fixative substance known in the art. For example, the adhesive may be a resin, an epoxy resin, a solder paste, or a tape.

The lead frames may be formed using conventional processes, for example, by chemical etching, stamping, or coining.

The chips may be electrically connected to the lead frames using suitable electrical connection means, such as by wire bonding.

In a further embodiment, the inventive method permits die-stacking multiple chips at the chip mounting area. For example, the method may include die-stacking one or more second chips onto the tops of the integrated circuit chips affixed to the lead frame. These second chips can be electrically connecting to the lead frame, or to the integrated circuit chips affixed to the lead frame, or to both. Combinations of such connection methods are possible. The second chips may also be electrically connected to each other.

Another aspect of the present invention provides for a partially patterned lead frame for use in the manufacture of an electronic package.

The partially patterned lead frame may be comprised of a film having a top surface and a bottom surface. The film may have a top surface having (a) a first region partially patterned from the top surface but not entirely through to the bottom surface, and (b) a second region not partially patterned from the top surface. The second region can form a chip pad area for supporting an integrated circuit (IC) chip and a plurality of electrical leads for providing electrical connections to the IC chip. The chip pad area and plurality of electrical leads may be connected via the first region but not connected through the top surface. The bottom surface of the film may also be partially patterned from the bottom surface but not entirely through to the top surface.

The top and bottom surfaces of the lead frame may be patterned in any particular manner. For example, the top and bottom surfaces may be patterned in a complementary pattern such that the two surfaces have substantially identical features on both sides of the lead frame.

The bottom surface of the lead frame may be patterned with hatchings, channels, or both. Such hatchings or channels advantageously permit side vents and side ventilation so there is no trapped air during reflow.

A further embodiment of another aspect of the present invention provides for a method for forming chip scale packages. The method comprises providing a partially patterned lead frame having (a) a first region partially patterned from the top surface but not entirely through to the bottom surface, and (b) a second region not partially patterned from the top surface. The second region forms (a) a chip pad area for supporting an integrated circuit (IC) chip and (b) a plurality of electrical leads for providing electrical connections to the IC chip. The chip pad area and plurality of electrical leads may be connected via the first region but not connected through the top surface.

An integrated circuit chip is then attached to the chip pad area of the first region of the lead frame. Electrical connections are then formed between one or more terminals on the chip and one or more electrical lead portions on the lead frame. The lead frame is then encapsulated by applying an encapsulate material over the lead frames and street portions. The bottom surface of the lead frames is then back-patterned to remove the webbed portions and street portions. A small portion of the bottom surface of the chip pad area is also removed to form one or more channels through the chip pad area. These channels advantageously permit side vents and side ventilation so there is no trapped air during reflow. The encapsulate material disposed over the street portions of the lead frame is then singulated to form individual chip scale packages, which are ready for subsequent use.

The channels of the chip pad area extend across the length of entire chip pad area, or they may extend across a portion of the chip pad area. These channels may be in the form of hatchings or other similar structure.

Another aspect of the present invention provides for a partially patterned lead frame for use in the manufacture of an electronic package. The lead frame comprises a film having a top surface and a bottom surface. The film is partially patterned from the top surface but not entirely through to the bottom surface. The film is also partially patterned from the bottom surface but not entirely through to the top surface. The patterning on the top surface is deeper than the patterning on the bottom surface. The resultant lead frame has deeper patterning on its top than on its bottom. The double-sided etching permits a reduced thickness for the portions of the lead frame which will be ultimately removed and thereby streamlining processing and manufacture of the resultant electronic packages.

Another aspect of the present invention provides for a chip scale package having a bottom surface with channels. The chip scale package comprises one or more encapsulated computer chips, and the channels functioning as air vents to reduce or eliminate trapped air during reflow.

BRIEF DESCRIPTION OF THE DRAWINGS

FIGS. 6b and 6c show progressively enlarged top views of the lead frames in the matrix shown in 6a.

FIGS. 26a and 26b are perspective and cross-sectional views of an embodiment of the invention wherein a plurality of chips are die-stacked to form a semiconductor package.

FIGS. 28a and 28b show perspective views of lead frames having a recessed chip pad area and die-stacked chips according to an embodiment of the present invention.

FIGS. 29a-29c show perspective views of lead frames having alterations according to an aspect of the present invention in the form of chip pad locking features.

FIGS. 33a-33b illustrate an aspect of embodiment of the invention wherein a clip is used in place of wire bonding to improve the power capability of the chip.

FIG. 35 illustrates a bottom view of the chip scale package prepared via the sequence shown in FIGS. 34a-34f.

FIG. 36a provides a cross-sectional view of the chip scale package shown in FIG. 34f.

FIG. 36b provides a cross-sectional view of another embodiment of the invention wherein the chip scale package comprises a plurality of die-stacked wire-bonded chips.

DETAILED DESCRIPTION

The present invention will now be described with reference to the Figures, wherein like numeral refer to like elements. FIGS. 4-15b and FIGS. 16-24b show different embodiments of forming a partially patterned lead frame package with lead counts comparable to that of near-chip scale packages (CSPs). The method of the invention improves the automation of the manufacturing line and the quality and reliability of the packages made therefrom. This is accomplished by performing a major portion of the manufacturing process steps with a partially patterned metal film formed into a web-like lead frame on one side. In contrast with conventionally punched through stencil-like lead frames, the lead frame used in the invention is partially patterned on one side and is solid and flat on the other side. This construction is improved both mechanically and thermally, and performs without distortion or deformation during the chip-attach, wire bond, and encapsulation processes. The bottom surface may be masked or otherwise marked to delineate the regions which will be eventually removed by back-etching. After the chip attach and wire bonding process steps are completed and the chip and wire bonds are affixed and hermetically encapsulated in a molding material, the bottom surface is partially etched through the film, in the areas which are not masked by the selective pre-plating of the bottom surface, to isolate the lead contacts from the chip-pad and each other. Subsequently, the resultant encapsulated package is singulated without having to cut into any additional metal.

More specifically, FIGS. 4-15*b* show the forming of a partially patterned lead frame for a wire-bonded chip and a method of using the same for forming an ELP-type electronic package. FIGS. 16-22, on the other hand, show the forming of a partially patterned lead frame for a flip-chip and a method of using the same for forming an ELPF-type electronic package. A method of forming an ELGA-type of electronic package, using the instant partially patterned lead frame, is also described in connection with FIGS. 24*a* and 24*b*.

Figure 1A:
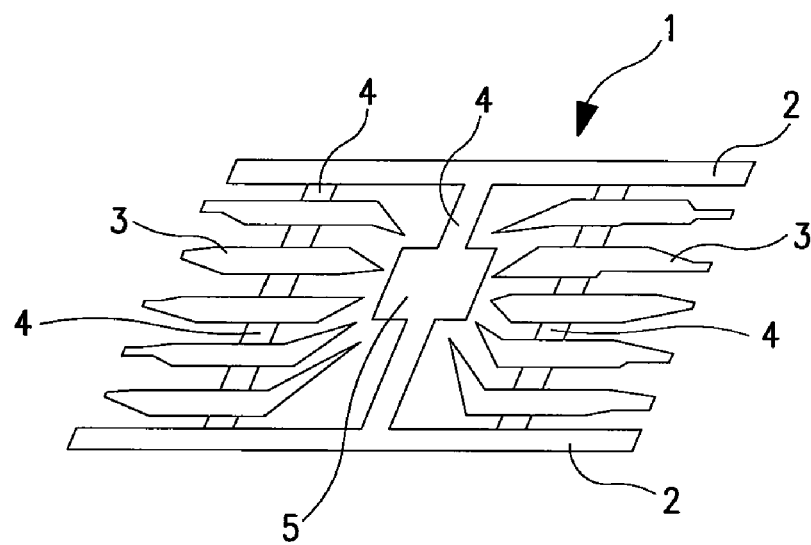
FIG. 1a is a diagram of a conventional lead frame with leads and a chip-pad area, according to prior art.
Figure 1B:
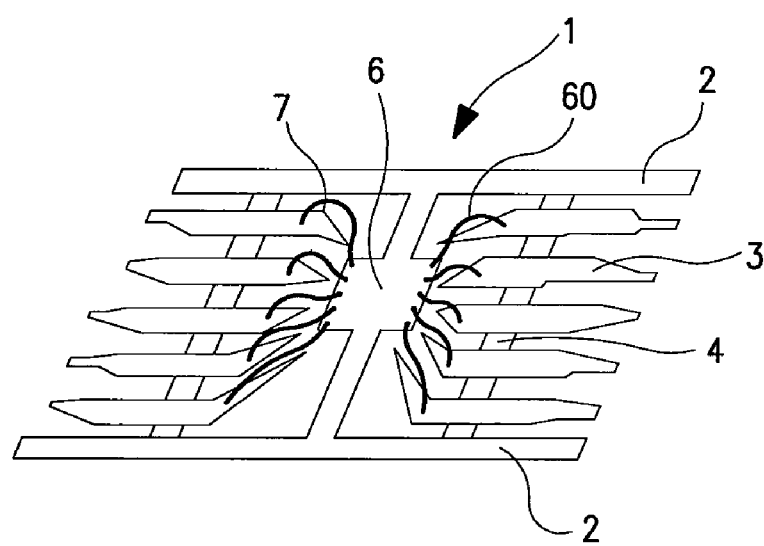
FIG. 1b is a diagram of the conventional lead frame of FIG. 1a showing the attachment of a chip to the chip-pad, and the wire bonding of the terminals on the chip to the leads, according to prior art.
Figure 2A:
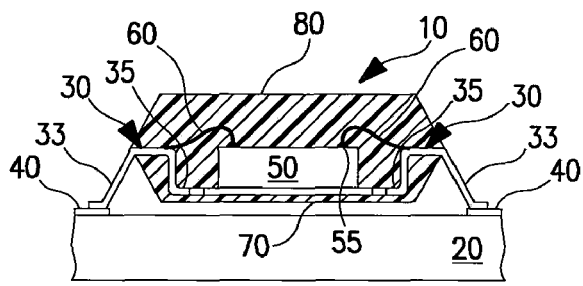
FIG. 2a is a cross-sectional view of a wire-bonded and leaded (with leads) near-chip scale package (CSP), showing connection to the next level of packaging by means of leads, according to prior art.
Figure 2D:
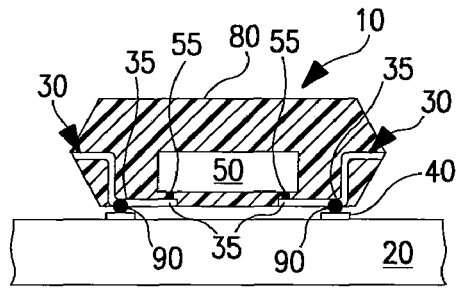
FIG. 2d is a cross-sectional view of a flip-chip and leadless near-CSP, showing connection to the next level of packaging by means of solder balls, according to prior art.
Figure 2B:
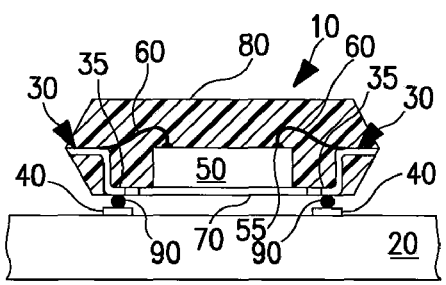
FIG. 2b is a cross-sectional view of a wire-bonded and leadless (with no leads) near-CSP, showing connection to the next level of packaging by means of solder bumps or balls, according to prior art.
Figure 3A:
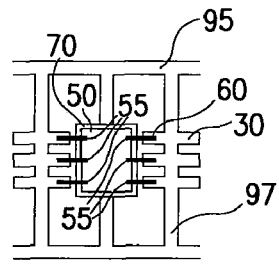
FIG. 3a is a top view of a stencil-like lead frame showing the wire-bonded connection of a back-bonded chip to the leads of the lead frame, according to prior art.
Figure 2C:
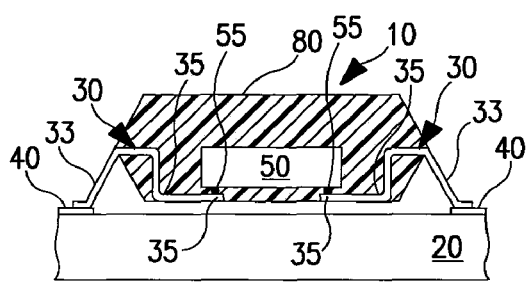
FIG. 2c is a cross-sectional view of a flip-chip and leaded near-CSP, showing connection to the next level of packaging by means of leads, according to prior art.
Figure 3B:
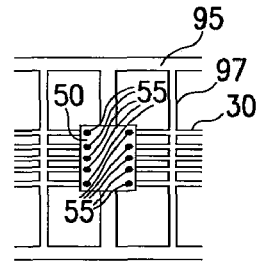
FIG. 3b is a top view of a stencil-like lead frame showing the connection of a flipped chip to the leads of the lead frame through a solder reflow process, according to prior art.
Figure 4:
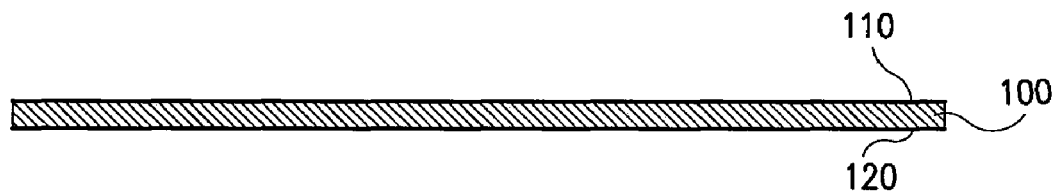
FIG. 4 is a cross-sectional view of a metal film of uniform thickness pre-plated on both sides with a bondable material, according to the present invention.

FIG. 4 is a cross-sectional view of a film, preferably a sheet of metal, preferably copper, that is not only to be formed into a lead frame, but also to serve as a stable carrier during the ensuing process steps of forming the lead frame. The thickness of the strip of metal is equal to or greater than about 0.05 mm. In another embodiment, the thickness can be in the range between about 0.05 to 0.5 mm.

Forming a lead frame typically involves cutting through the strip of metal, like cutting a stencil, and then working with very fine finger-like leads. In order to hold down such a delicate structure in place, a vacuum chuck may be used. Conventional vacuum chucks, however, typically are not adapted to provide suction for such delicate devices and the lead frame must usually be clamped down peripherally. Any rigging used for this purpose must be refitted from one type and size of lead frame to another. The instant invention, however, alleviates this refitting step. Because the bottom surface of the partially patterned lead frame is solid and continuous, a conventional vacuum chuck can easily hold the lead frame in place during processing. Furthermore, one size strip of metal that can accommodate the various industrial lead frames can be used universally in the manufacture of the lead frames. The subsequent process steps of chip attach and wire bonding can be accomplished with much less stress and strain on the lead frame to be formed. Lead frames with much finer geometries can easily be fabricated because the leads are held together by the web-like structures and are not separated from each other until the very final step.

Forming of the various patterns on the lead frame can be accomplished in a number of ways. One approach can be stamping/coining the pattern into the metal. Other approaches may include chemical or electrochemical milling and electrical discharge machining (EDM). On the other hand, photolithographic patterning, which is a mainstay of semiconductor manufacturing, is preferred. In the present invention, metal strip (100) shown in FIG. 4 is pre-plated on both the front (or top) side and the back (or bottom) side prior to the photolithographic patterning. Either or both the front surface and the back surface may be pre-plated with a material that enables bonding as well as solder ability, respectively. In one embodiment, the front surface is pre-plated with a bondable material, such as Ni/Pd/Au-strike or Ag. In another embodiment, the back surface is pre-plated with a solderable material, such as Sn/Pb, lead-free solder, immersion-tin electroless-nickel or Au-strike. In another embodiment, the back surface is pre-plated with the same material as the top side, which can then act as a resist during back-patterning. This resist-like plating can later be stripped prior to final finishing. The pre-plating can be performed at a later step, if so desired.

Figure 5:
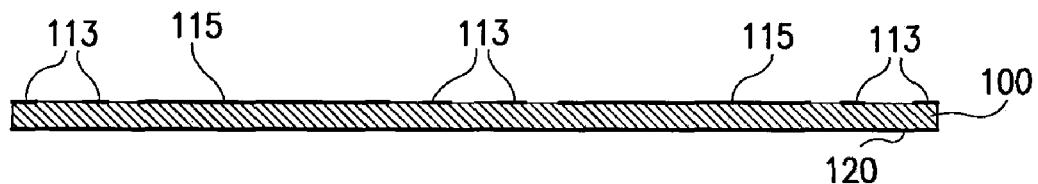
FIG. 5 is a cross-sectional view of a metal film of FIG. 4, where only the pre-plating on the top surface has been patterned corresponding to two chip sites with each site including a chip-pad and lead contacts surrounding each chip-pad, according to the present invention.

At the next step, the pre-plated front side (110) is photo-lithographically patterned to form areas corresponding to chip-pad (115) and electrical contacts (113) surrounding the chip-pad area. An electrical contact (113) can be characterized as the end portion of a lead that is connected to the chip-pad area (115) through a first region of intermediate recessed portions that forms the web-like structure. These intermediate recessed web-like portions are removed at a later time when metal film (100) is etched from the back so that the end portions and the chip-pad portions will be isolated from each other. The areas comprising a chip-pad (115) and the surrounding contacts (113) are sometimes referred to as chip sites. A plurality of chip sites can be formed on a continuous roll of copper sheet sprocketed to a spool to easily automate the forming of lead frames comprising one or more chip sites. FIG. 5 illustrates two chip sites, which will be formed into two corresponding lead frames, which in turn will be part of two packages that will be formed from them.

Figure 6:
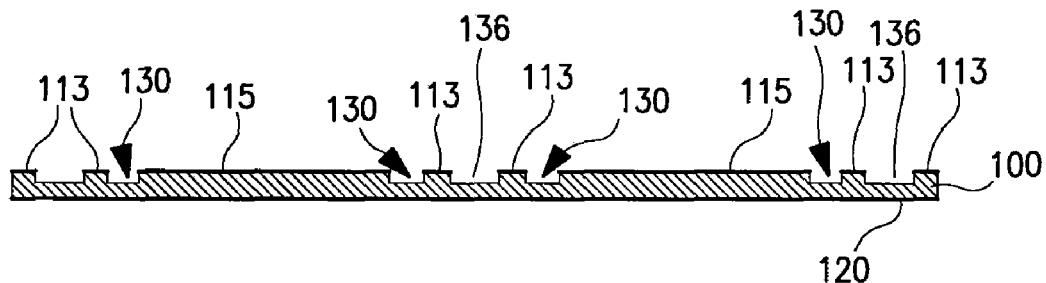
FIG. 6 is a cross-sectional view of the plated metal film of FIG. 4, which has been partially patterned, according to the present invention.

The pattern shown for the two chip sites illustrated in FIG. 5 is then transferred into film strip (100) by etching. As shown in FIG. 6, a main feature of the present invention is that the etching is performed only partially through the thickness of the metal, which is referred to herein as partial patterning. The partial patterning is performed in a first region of the film to form a webbed structure (130) that connects the chip pads (115) of lead contacts (113) of each lead frame. The first region also connects the lead frames to one another at street portions (136) of the film.

Figure 6B:
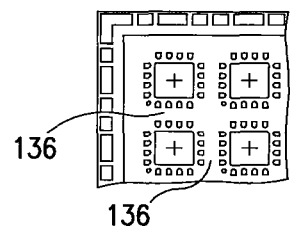
Figure 6C:
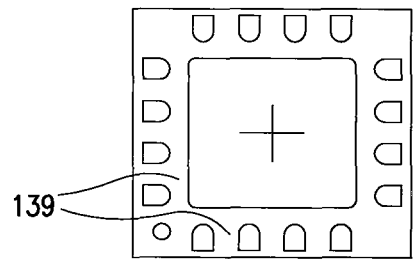
Figure 6A:
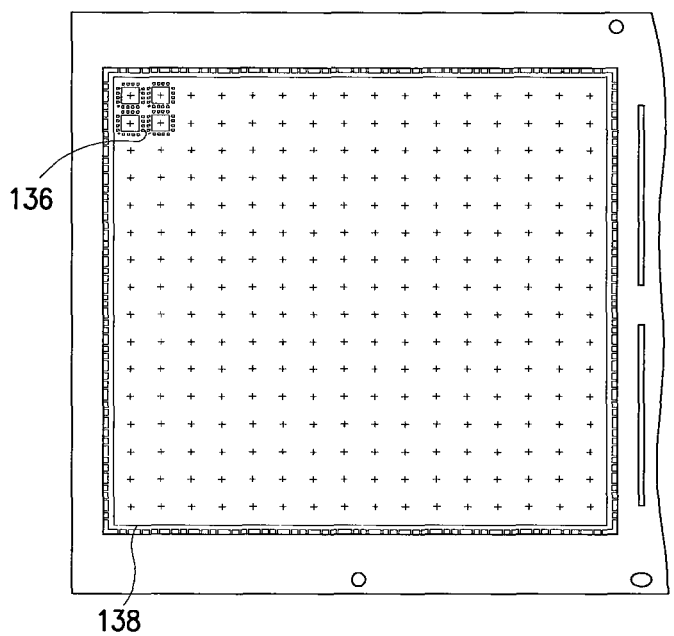
FIG. 6a is a top view showing a matrix of partially patterned lead frames according to the present invention.

As shown in FIGS. 6*a-c*, a matrix or such lead frames (for example, 16×16) may be formed in a block/window film (138). FIGS. 6*b* and 6*c* show that the first region includes the webbed structure (139) connecting the chip pad and lead contacts of each lead frame. The first region also connects the plurality of lead frames to one another at street portions (136) of the film.

In one embodiment, the partial patterning can vary from 25% to 90% of the thickness of the film. The partial patterning, however, may be virtually any percentage of the thickness of the film and the amount of partial etching can be determined by considering various factors affecting the manufacturability parameters, including flexibility, rigidity, and thermal thickness (or thermal conductance). The lateral dimensions of lead contact areas (113) and chip-pad areas (115) can be determined based on the degree of miniaturization desired for given chip sizes and wire bonds or other connecting media that may be used for interlevel or intralevel connections in a given package or between packages at the next level of packaging. It is especially noted that manufacturability concerns for fine features and dimensional stability of the lead frame are of lesser significance now by virtue of the web-like structure of the finger-like leads.

Figure 7A:
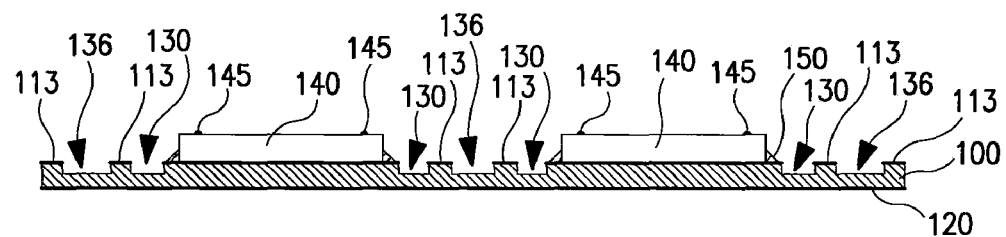
FIG. 7a is a cross-sectional view of the partially patterned metal film of FIG. 6 where a chip has been attached to the chip-pad on each of the two chip sites, according to the present invention.
Figure 7B:
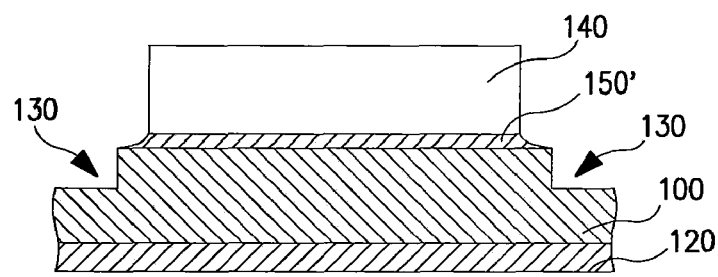
FIG. 7b is an enlarged view of the joint between the chip and the chip pad showing the attachment comprising epoxy or solder, according to the present invention.
Figure 8:
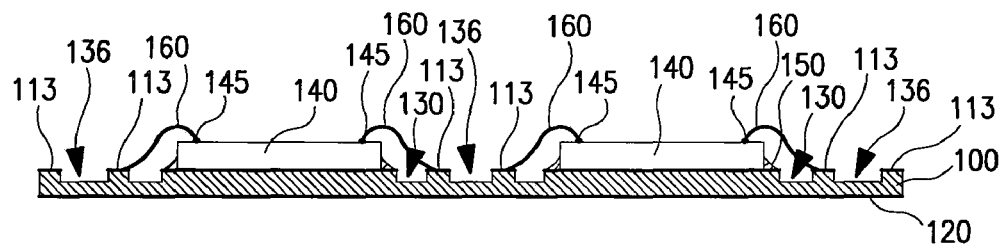
FIG. 8 is a cross-sectional view of the chip attached metal film of FIG. 7a or 7b, where the terminals on each chip have been wire bonded to the lead portions of the lead frame so formed on each chip site, according to the present invention.

As shown in FIG. 7, chips (140) are next attached to the chip-pad areas using any convenient means, such as an epoxy (150). The joint between the chip and the chip pad showing the attachment comprises of epoxy or solder, according to the present invention. Epoxy (150) may be filled with conductive particles to enhance the cooling of the chip. In the alternative, solder paste (150'), in place of epoxy (150), may also be used to provide both a stronger bond between the chip and the chip-pad, and a more effective cooling path to the ambient environment. The epoxy is cured and, as shown in FIG. 8, After chip attachment, wires (160) are bonded to terminals (145) and to corresponding lead contacts (113) using well-known wire bonding techniques, as shown in FIG. 8. Because the lead frame formed according to the present invention has a solid, continuous back side that is firmly seated and held down on a flat surface such as by a vacuum chuck (not shown), the web-like structure of the leads do not flutter or bounce during wire bonding. This results in excellent bonds, which improves the reliability of the end product. Even though the back side is solid and continuous, it may still have indicators as to where back-etching will occur. For example, the back side may have breaks or other indicators, which may be part of the surface of the film, or the back side may be masked with a pre-plating material (120) to delineate the intended regions which will be back-etched. For example, the pre-plating material (120) may be masked beneath areas (113) to indicate the corresponding portion of the lead frame will remain during later etching and that the areas beneath areas (130) and (136) will be removed.

Figure 9:
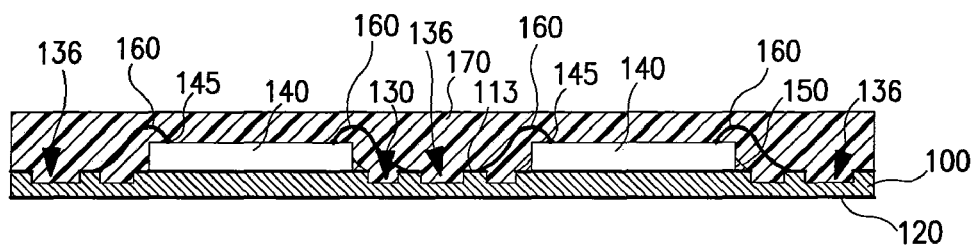
FIG. 9 is a cross-sectional view of the wire bonded lead frame of FIG. 8 where the top surface of the metal film, including the chips and the wire bonds have been hermetically sealed in an encapsulate, according to the present invention.

In FIG. 9, after connecting the chips and the corresponding contacts, all the components on the front side of the metal film are then hermetically encapsulated in a molding material, for example, by a resin. Encapsulate (170) is formed over the film and all exposed surfaces, including the lead frames and their associated wires (160), chips (140) and contacts (113) as well as the webbed structure (130) and street portions (136). When the resultant molded package is lifted up, the clean backside is now available for further processing. The commonly encountered problem of mold flashing to the footprint on the underside of the package is eliminated with this disclosed method. The clean backside may have been previously plated with a substance which will facilitate subsequent processing or etching.

Figure 10:
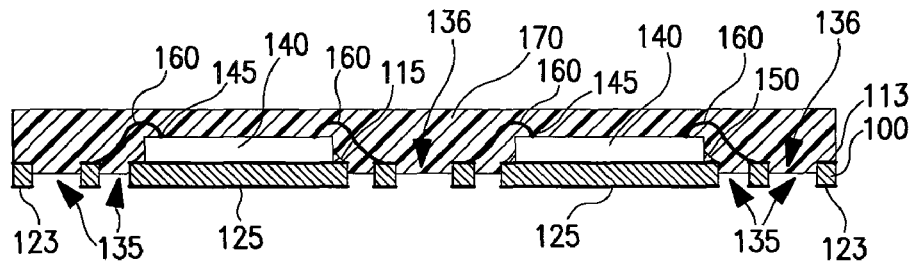
FIG. 10 is a cross-sectional view of the hermetically sealed package of FIG. 9 that has been etched from the backside to remove the first region of each lead frame and the street regions in the film, according to the present invention.

As shown in FIG. 10, both the lead contacts (113) and the chip-pads (115) can now readily be isolated from one another to form their own islands by etching the webbed structure (135) of the first region through the back side of the package. At this point, the street portions (136) are also back etched. Pre-plating (120) using a substance such as a printable ink or an organic material can be used as a mask or resist to form the desired bottom features (123, 125). In other embodiments, an organic material can be used in place of the metal or solderable material as the etching mask. The organic material can be printed or applied onto the lead frame at any convenient step before back-etching.

The back etching continues until the molding material is reached. The etch method for back etching the metal may differ from that used for the front side. The etch time for the back side, may differ from that used for the front side, depending upon the degree of partial etching that was performed from the front side. Thus, the initial forming of the partial etch lead frame can be custom tailored to fit the manufacturing requirements for automation, quality, reliability and functionality of the final package. Pre-plating at the bottom (120) that functions as a chemical resist may be stripped to expose the metal strip (100).

To protect the material and ease of mounting to the printed circuit board, solderable material such as electroless Ni/immersion Au, immersion Sn, or other such materials can be plated to the metal strip (100). Any pre-plating may remain or be stripped off, as deemed suitable for the particular circumstances.

Figure 11:
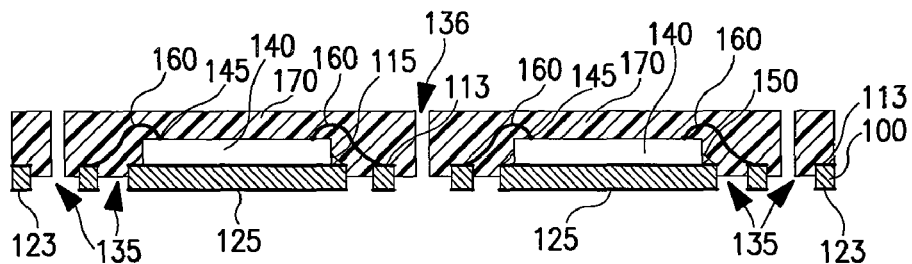
FIG. 11 is a cross-sectional view of two near chip size partially patterned packages wherein the encapsulate has been singulated in the street regions, according to the present invention to form two separate packages. These packages may be ultrasonically bonded with aluminum wires, copper wire ball bonding techniques, or with any other convenient bonding technique.

As a final step, the encapsulate (170) over the street portions (136) between the lead frames is singulated to form two individual packages as shown in FIG. 11. This is accomplished in a number of ways, including saw slicing, water-jet-cut, laser-cut, or a combination thereof, or other techniques that are especially suitable for cutting plastics. In other words, there is no more metal to cut through and hence no delamination and other problems associated with cutting plastic and metal in combination. This is to be compared with conventional packages, where bridging metal between streets must be cut at the same time that the package is being singulated. Many times, when cutting both metal and plastic at the same time, some of the metal chips can short lines and contacts, causing unwanted and unpredictable wear on the saw blades. As shown in FIG. 6a, this method may also be applied to produce a great number of packages from a matrix of lead frames.

Figure 12A:
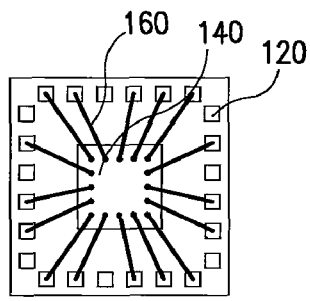
FIG. 12a is a top view of one of the singulated packages of FIG. 11 showing the chip, the contacts and the wires connecting the chip terminals to the lead contacts, and an enlarged cross section of one of the contacts with a wire bond, according to the present invention.
Figure 12B:
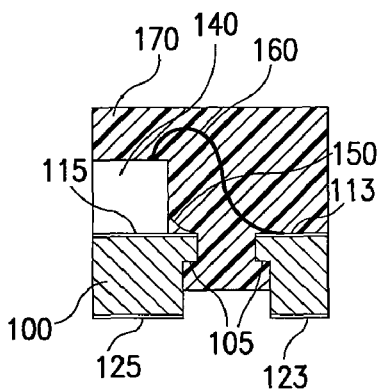
FIG. 12b is a cross-sectional view of the area between the chip-pad and one of the contacts showing the use of a "lip" on the vertical surfaces that come into contact with the molding material in order to provide anchoring and prevent delamination, according to the present invention.
Figure 12C:
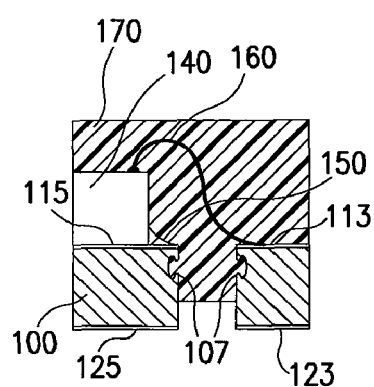
FIG. 12c is a cross-sectional view of the area between the chip-pad and one of the contacts showing the use of different shapes of cavities on the vertical surfaces that come into contact with the molding material in order to provide anchoring and prevent delamination, according to the present invention.
Figure 13A:
FIGS. 13a-13f are diagrams of various cavities that can be used to provide anchoring means for molding material on the vertical surfaces shown in FIGS. 12b and 12c, according to the present invention.
Figure 13D:
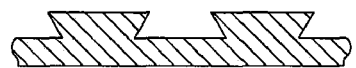
Figure 13B:
Figure 13E:
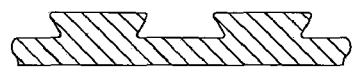
Figure 13C:
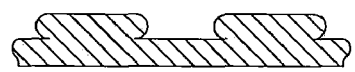
Figure 13F:

A top cross-sectional view looking down through the encapsulate of a singulated ELP is shown in FIG. 12a. FIG. 12b shows an enlarged view of a corner of the package between the chip and one of the contacts comprising a portion of the original metal strip (100), a top surface pre-plated to form bondable layer (113), and a bottom surface pre-plated to form solderable layer (123). In FIG. 12b, a "lip" is shown both on the contact and the corner of the chip. The contacts (113) and chip (140) are shown isolated from one another on their own islands, but only connected with each other through wires (160) that have been wire bonded.

The solderable pre-plated surface (120) on the underside of the package if not stripped can now be used for several purposes. First, direct external access to the back (125) of chip-pad (140) provides an additional heat path for cooling. Second, contacts (123) within the footprint of the near-chip size package (CSP) make it possible to mount tightly spaced packages at the next level of packaging, and hence increase performance for the same area.

Another aspect of the present invention provides a means for lessening the possibility of delamination between the molding material and the surfaces to which it should adhere. This is accomplished by half-etching the edges around the chip-pad and the contact areas to form a ledge or a "lip", such as referenced by numeral (105) in FIG. 12b. It is also possible to form irregularly shaped cavities (107) shown in FIG. 12c to enhance the interlocking mechanism of the surfaces that come into contact with the molding material. Enlarged views of various other cavities are also shown in FIGS. 13a-13f, and forming of these surface enhancements can readily be incorporated into the partial etching from the front side. This will not be necessary for etching from the backside inasmuch as the molding material encapsulates only the surfaces that are formed partially from the front side.

Figure 14:
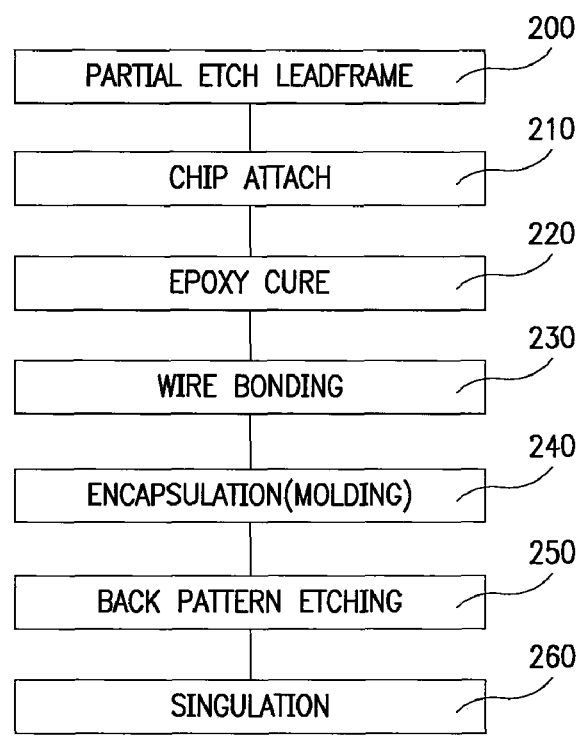
FIG. 14 is a flow chart summarizing the various process steps of forming a partially patterned package, according to the present invention.

FIG. 14 summarizes the method of the present invention as commencing with the partial etching of a lead frame (200) into a metal strip from the front side and ending with the back pattern etching (250) of the same metal strip in such a way so as to form the desired chip-pad and the surrounding contacts. The intermediate steps of chip attach (210), epoxy cure (220), wire bonding (230), and encapsulation (240) are all accomplished on a mechanically and thermally stable lead frame, because the leads are still connected through the first region of intermediate recessed portions on a partially etched web-like or webbed structure in the metal film. It is also important to note that it is only after all the components of the package have been secured in an encapsulate that the first region of intermediate recessed portions is removed through back pattern etching (250), and the peripheral contacts as well as the chip-pad are made to separate from each other for proper isolation. Prior to the final step, stripping the pre-plating (120) and applying solderable material can be performed.

Consequently, there is no need to cut through any metal during singulation (260) into single near chip-size packages.

Figure 15A:
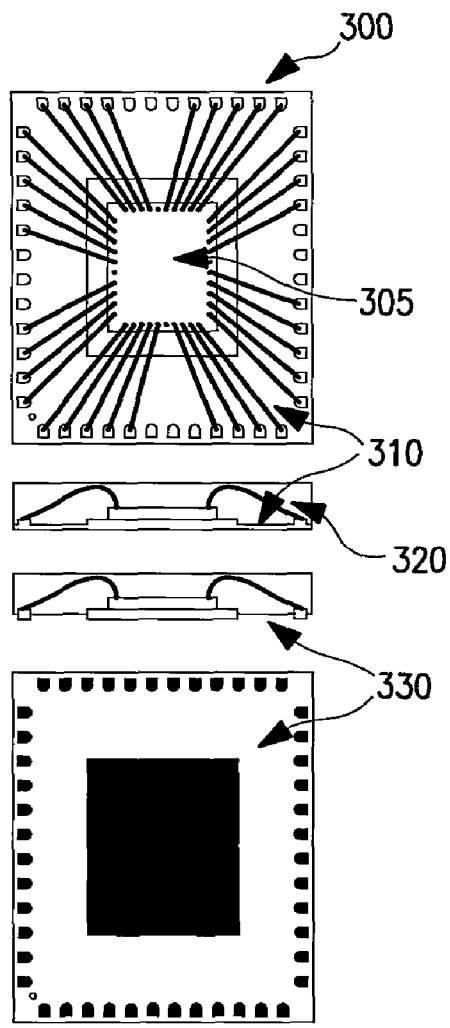
FIG. 15a is a diagram showing the top, side and bottom views of a package with a peripheral I/O configuration, according to the present invention.
Figure 15B:
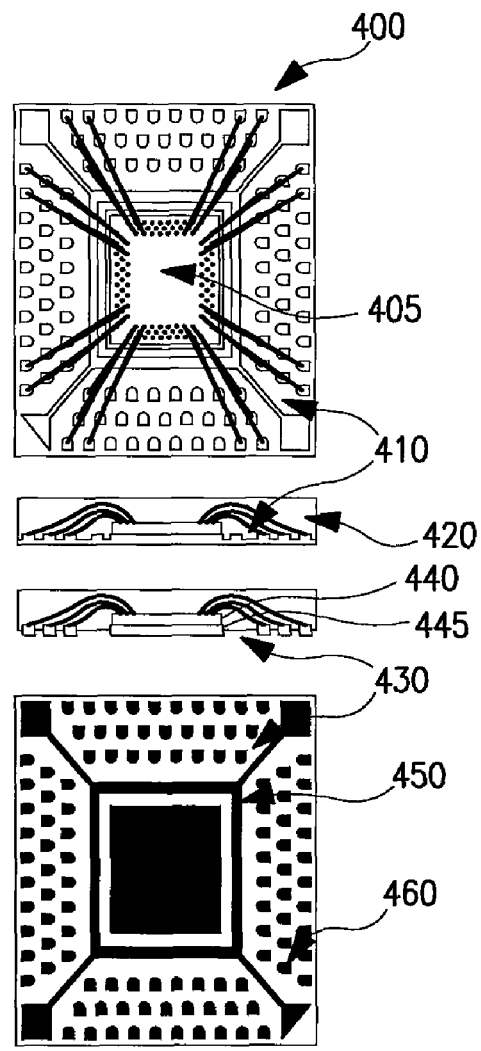
FIG. 15b is a diagram showing the top, side and bottom views of a package with an array configuration of I/O pads, according to the present invention.

The method of the present invention may be used to form a wide variety of packages, such as an array type of a lead frame for an electronic package. A top view of an array type package (400) is shown in FIG. 15*b* next to the standard peripheral type package (300) shown in FIG. 15*a*. While numeral (305) references a peripheral arrangement of chip terminals, numeral (405) references an array type arrangement of the terminals, which can be configured in-line or staggered. Both packages are formed using the disclosed partial patterning invention as indicated by reference numerals (310) and (410). In the array type ELP, inner leads (440) and outer leads (445) are shown. Both packages are encapsulated in molding material (320) or (420). Back pattern etching to isolate the contacts and the chip are indicated by (330) and (430). Numeral (450) depicts a ground ring feature, which is etched to the same level as the mold. Numeral (460) points to the array type input/output configuration on the bottom view of the ELP.

The second embodiment shown in the drawings 16-24*b* discloses a method of forming a partially patterned VFQFP-N type lead frame, which is especially suitable for mass producing FC electronic packages. The lead frame made to accommodate the flip-chip will, hereafter, is referred to as FCL to distinguish it from conventional lead frames. This is because, unlike conventional lead frames, FCLs are sturdier and much more adaptable to automated manufacturing lines, as described below.

FCLs are also web-like structures in contrast to the conventional all-purpose punched through, stencil-like lead frames. The front side of a web-like FCL has recessed sections, including partially patterned leads, while the back side is solid and flat. This provides mechanical rigidity to perform without distortion or deformation during the manufacturing processes. After the completion of the chip attach and hermetic sealing of the package, the backside is etched to isolate the lead contacts from each other. Removing the pre-plating, or re-plating with other solderable material, can be accomplished by electroless or immersion processes. Subsequently, the resultant encapsulated package is singulated without having to cut into any additional metal. Thus, it will be apparent that FCLs with much finer geometries, such as with VFQFP-N packages, can easily be fabricated inasmuch as the leads are held together by the web-like, or webbed structures and not totally separated from each other until the very final step of singulation.

Figure 16:
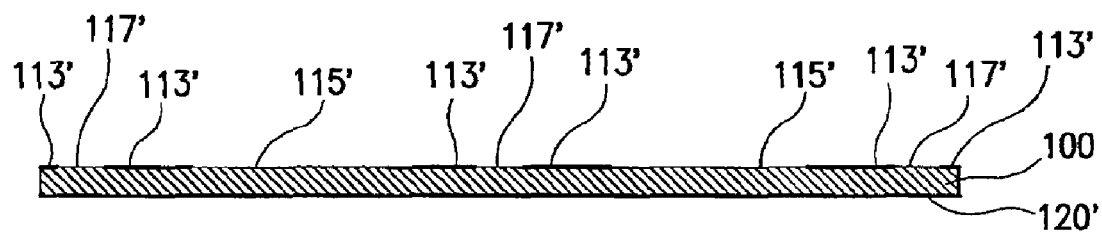
FIG. 16 is a cross-sectional view of a metal film of FIG. 4, where only the pre-plating on the top surface has been patterned corresponding to two flip-chip sites with each site including a chip receiving area and leads surrounding each chip receiving area, according to the present invention.
Figure 17:
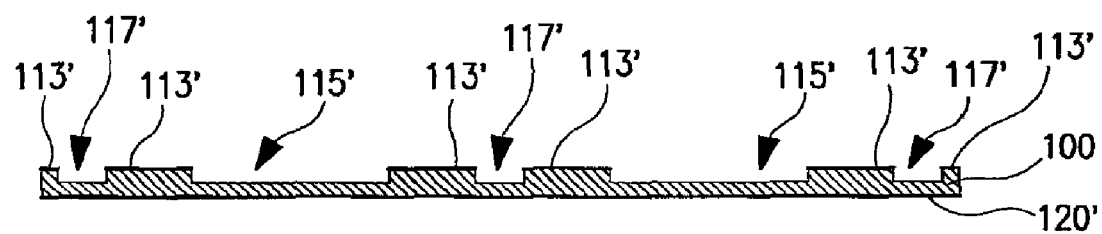
FIG. 17 is a cross-sectional view of the plated metal film of FIG. 16, which has been partially patterned to form a web-like lead frame (i.e., webbed structure), according to the present invention.

Like the already disclosed partially patterned lead frame of the first embodiment, the FCL of the second embodiment is also formed from a sheet of metal, preferably copper film as shown in FIG. 4, where both the front surface and the back surface are pre-plated, or, as stated previously, the plating can be deferred to a later step. (It is noted that, as the process steps for both embodiments are similar, the reference numerals have been kept the same as appropriate except for denoting those of the second embodiment with primes. The same reference numeral (100) has been kept for consistency for the metal film used for both embodiments). Then, the pre-plated front side (110') is photolithographically patterned to form chip receiving areas (115'), lead portions (113') surrounding the chip receiving areas, and other intermediate areas (117'). At a subsequent process step that is disclosed below, one end portion of the leads will be connected to the terminals of a PC, while the other end portion will be connected to the next level of packaging. The areas comprising a chip receiving area and the surrounding leads are sometimes referred to as a chip site, similar to the chip sites with wire-bonded chips. A plurality of lead frames comprising a plurality of chip sites can be formed on a continuous roll of copper sheet sprocketed to a spool to easily automate the forming of lead frames comprising one or more chip sites. FIG. 16 illustrates two chip sites, which will be formed into two corresponding lead frames, which in turn will be part of two packages that will be formed from them.

The pattern shown for the two chip sites illustrated in FIG. 16 is then transferred into metal film (100) by partial patterning through etching. The partial patterning shown in FIG. 17 may be up to one-half, one-quarter, or for that matter, any ratio of the thickness of the strip of metal, and the amount of partial etching can be determined by considering various factors affecting the manufacturability parameters including flexibility, rigidity, and thermal thickness (or thermal conductance). The lateral dimensions of lead contact areas (113') and chip areas (115') can be determined based on the degree of miniaturization desired for given chip sites including the chip size and the leads that may be used for interlevel or intralevel connections in a given package or between packages at the next level of packaging. It is especially noted that manufacturability concerns for fine features and dimensional stability of the lead frame are of lesser significance now by virtue of the webbed structure of the finger-like leads.

Figure 18:
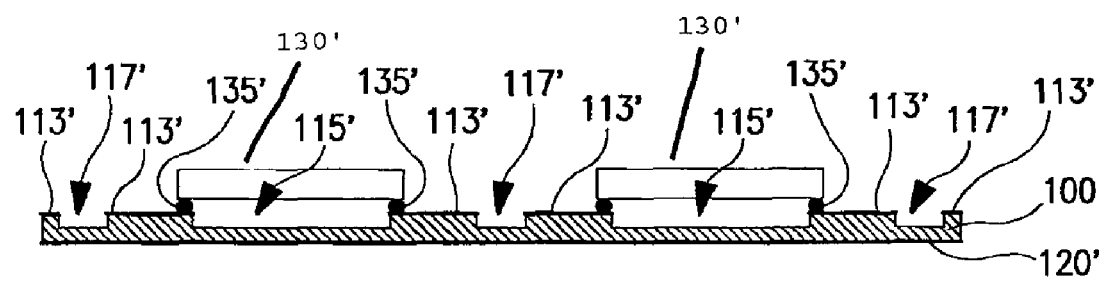
FIG. 18 is a cross-sectional view of a chip-joined lead frame (FCL) showing the flip-chip (FC) joining, according to the present invention.

Flip-chip (FC) (130') is then flipped over so that terminals (135') on the front side of the chip rest on one end portion of the leads as shown in FIG. 18. At a later step, the opposite end of the leads will be formed into electrical contacts for connection to the next level of packaging, such as a card or a board. First, however, chips assembled on the web-like lead frame structure shown in FIG. 18 are sent through a chip joining furnace as is practiced in the art. The solder balls are reflowed so that the reflow is limited by the BLM, thus forming solder pillars. Since the lead frame formed according to the present invention has a solid, continuous back side that is firmly seated and held down on a flat surface, the web-like structure of the leads do not flutter or bounce around in the chip-joining furnace, thereby yielding excellent chip joining. Consequently, the disclosed method improves the reliability of the end product, namely, that of the VFQFP-N type packages.

Figure 19:
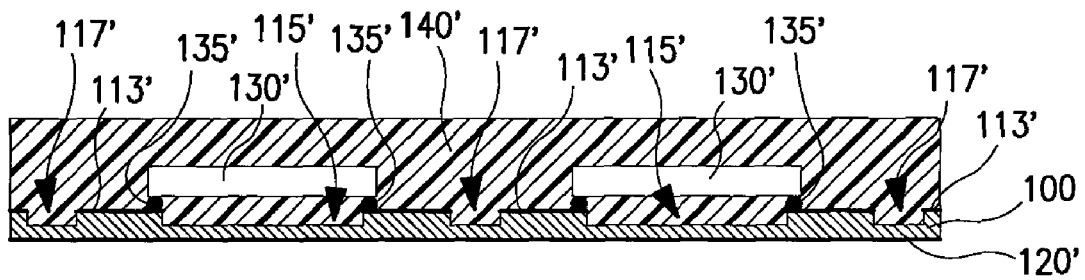
FIG. 19 is a cross-sectional view of the FCL of FIG. 18 where the top surface of the metal film, including the chips, has been hermetically sealed in an encapsulate, according to the present invention.

After chip joining, the chips, along with the partially patterned leads on the front side of the original metal film, are then hermetically encapsulated in a molding material, for example, by a resin, as shown in FIG. 19. Encapsulate (140') is formed around all exposed surfaces, including that of leads (113'), around solder balls (135'), underneath the chips, along the vertical walls of recessed chip receiving areas, (115') as well as that of the vertical walls of recessed areas (117') except for the unetched, solid and flat back side of strip of metal (100) that is held down firmly onto a flat surface. When the resultant molded package is lifted up, the clean backside is now available for further processing. The commonly encountered problem of mold flashing to the footprint on the underside of the package is eliminated in this embodiment as well.

Figure 20:
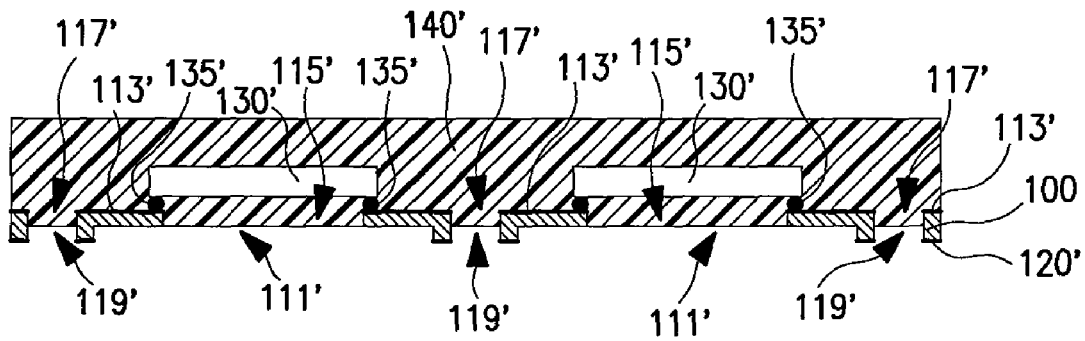
FIG. 20 is a cross-sectional view of the hermetically sealed package of FIG. 19 that has been etched from the backside to remove selectively the webbed portions between the individual leads and between the recessed chip receiving areas, according to the present invention.

Leads (113') can now readily be isolated from one another by patterning through the back side of the package in alignment with the pattern that was partially etched from the front side at the beginning of the process. The back etching continues until the molding material is reached. This is shown in FIG. 20 where web-like portions of the lead frames, namely areas (111') and (119'), are removed to disconnect chip areas (115') from each other, and leads (113') from each other. The etch recipe for back patterning the metal may or may not be the same as the recipe that was used for partial etching from the front side. Also, the etch time from the back side may differ from that used for the front side depending upon the degree of partial etching that was performed from the front side. Thus, the initial forming of the partial etch lead frame can be custom tailored to fit the manufacturing requirements for automation, quality, reliability and functionality of the final package. Pre-plating at the bottom (120) that functioned as a chemical resist may be stripped to expose the metal strip (100). To protect the material and ease mounting to the printed circuit board, solderable material such as electroless Ni/immersion Au, immersion Sn, or other material can be plated to the metal strip (100).

Figure 21:
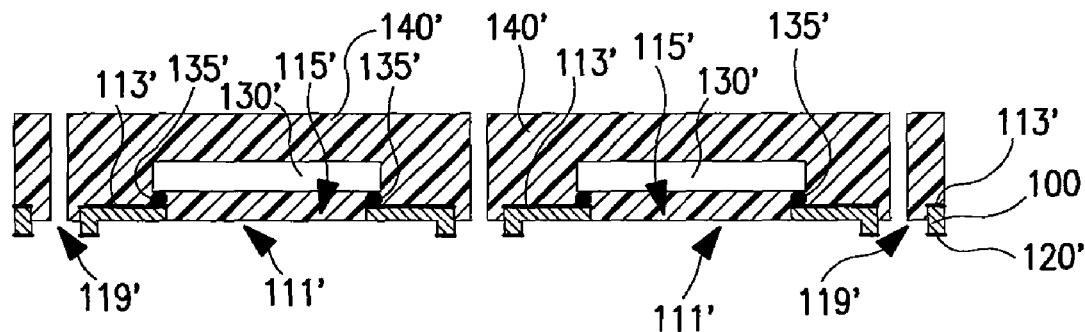
FIG. 21 is a cross-sectional view of two near chip size partially patterned packages that have been singulated from the package of FIG. 20, according to the present invention.
Figure 22A:
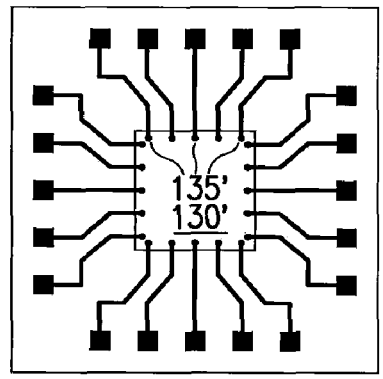
FIG. 22a is a top view of one of the singulated packages of FIG. 21 showing the chip and the leads connecting the chip terminals to the end portions of the leads, which are in turn connected to the next level of packaging, according to the present invention.
Figure 22B:
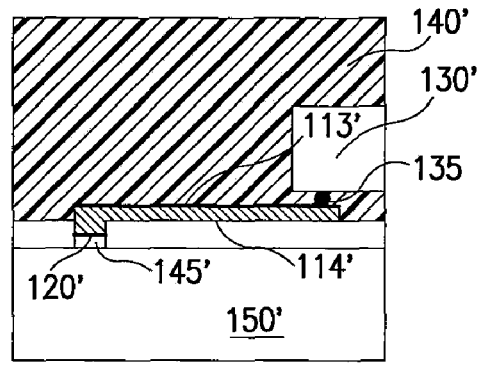
FIG. 22b is an enlarged cross-sectional view of the area between the flip chip and the connection to the next level packaging showing the two end connections of a lead, according to the present invention.

As a final step, the package of FIG. 20, having two encapsulated chip sites for the purposes of illustrating the present invention, is next singulated into singular near-chip size packages (CSPs), which are more of the VFQFP-N type packages, as shown in FIG. 21. A top view of a singulated partially patterned lead frame package is shown in FIG. 22a, where leads (113') are shown isolated from one another and connected to solder balls (135') on the underside of chip (130'). FIG. 22b shows an enlarged view of a corner of the package between the chip and one of the leads connected to an external contact (145') that may be provided on a card or a board (150'). The pre-plated surface (120') is already prepared to be joined to the next level of contact as shown in the same Figure. The pre-plating or masking may be retained or removed, as deemed suitable or desirable at this time. The pre-plating or masking may also be removed at other times in the process as appropriate for the individual circumstances. Also, the underside (114') of leads (113') is exposed to the ambient environment, thus providing enhanced cooling. In some cases, a coating can be applied to the underside (114) to reduce the chances for potential shortening during board mounting, especially for fine pitch applications.

The same techniques as disclosed before may be used to prevent the delamination of the encapsulate from the surfaces of the FCL, namely, by incorporating the irregularly shaped cavities of FIGS. 13a-13f on the vertical walls of the recessed areas (115') and (117') of the webbed lead frame. The forming of these surface enhancements can readily be incorporated into the partial etching from the front side. This will not be necessary for etching from the backside inasmuch as the molding material encapsulates only the surfaces that are formed partially from the front side.

Figure 23:
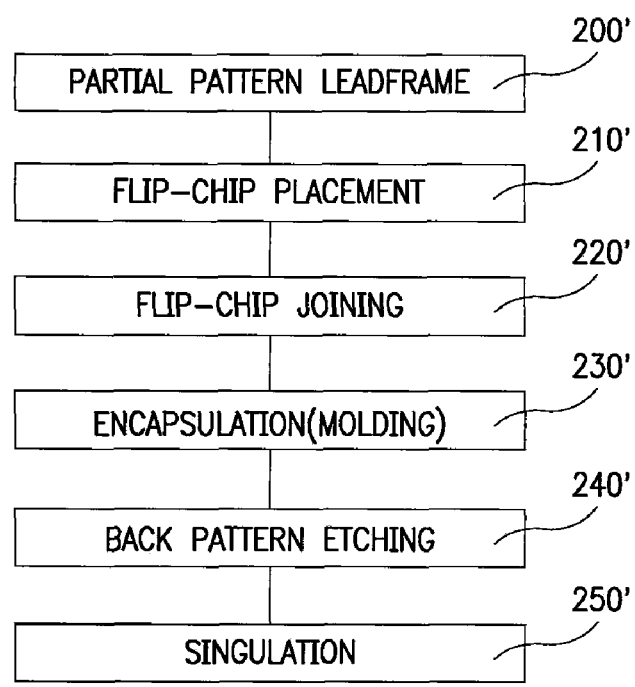
FIG. 23 is a flow chart summarizing the various process steps of forming a partially patterned package supporting a flip-chip, according to the present invention.

FIG. 23 summarizes the method of the present embodiment as commencing with the partial patterning of a lead frame (200') into a metal strip from the front side and ending with the back patterning (240') of the same metal strip in such a way so as to form the desired chip receiving areas and the surrounding leads. The intermediate steps of FC placement (210'), FC chip joining (220'), and encapsulation (230') are all accomplished on a mechanically and thermally stable FCL because the leads are still connected through the partially etched web-like structure in the metal film. It is also important to note that it is only after all the components of the package have been secured in an encapsulate that the web portions of the leads are removed selectively through back pattern etching (240'), and the leads are made to separate from each other for proper isolation. Consequently, there is no need to cut through any metal during singulation (250') into single near chip-size package.

Figure 24A:
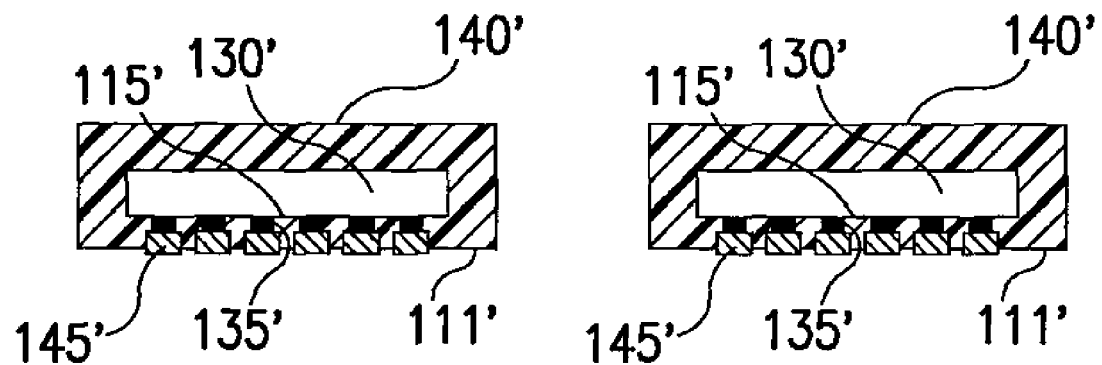
FIGS. 24a and 24b show a cross-sectional view and a bottom view of two near chip size partially patterned packages that have been singulated, and then provided with land grid array connectors for connection to the next level of packaging to form an ELGA-type package, according to the present invention.
Figure 24B:
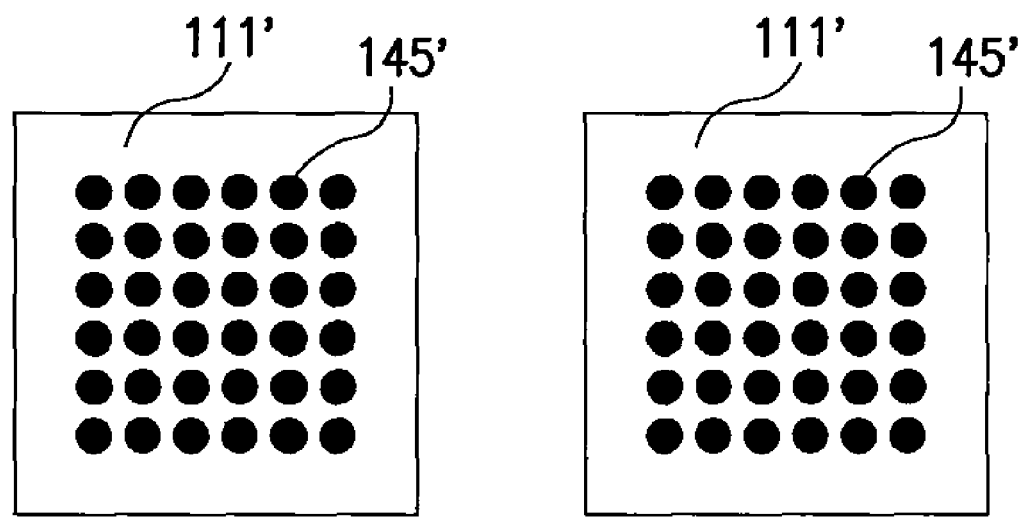

The method of the invention may be used to form a wide variety of packages, such as an array type of a partially patterned lead frame where an area array of solder bumps can be chip joined simultaneously on to the lead frame with the chip flipped over, similar to the method disclosed herein with a peripheral set of solder bumps. Also, an array of partially patterned lead frames themselves can be formed simultaneously, and then FC joined also simultaneously, followed by singulation of the array into a multiplicity of separate VFQFP-N type packages. Also, each resulting CSP can then be provided with solder bumps, pads, or other electrical connections underneath the package for array type joining on to the next level of packaging to form an etched lead frame package with land grid array, or ELGA-type package shown in FIGS. 24a and 24b. In FIG. 24a, a cross-sectional view is shown where chip pads (135') are formed over the leads (145'). Subsequent to the back-patterning, leads (145') are electrically isolated from each other to be joined to the next level of packaging. The exposed bottom surfaces of (145') can be flash finished with any number of solderable materials through immersion-tin dipping or electroless-nickel plating. The bottom surface (111') of the ELGA package is shown in FIG. 24b with an array pattern for the electrical connections (145').

The solder bumps may be in the form of a metal pillar bump, such as a copper pillar bumps, wherein each bump is comprised of a shaft having of Cu around 75 microns in height that has solder (or Pb-Free) caps to result in a total height of around 100 microns. The "solder bumps" would be the "solder caps" when using Cu-Pillar Bumps. The use of Cu-Pillar is to give a standoff between the Chip surface UBM and the board point of contact by more than 50 microns and enable the plastic encapsulation to freely flow and cover the crevices under the flipped chip.

Figure 25A:
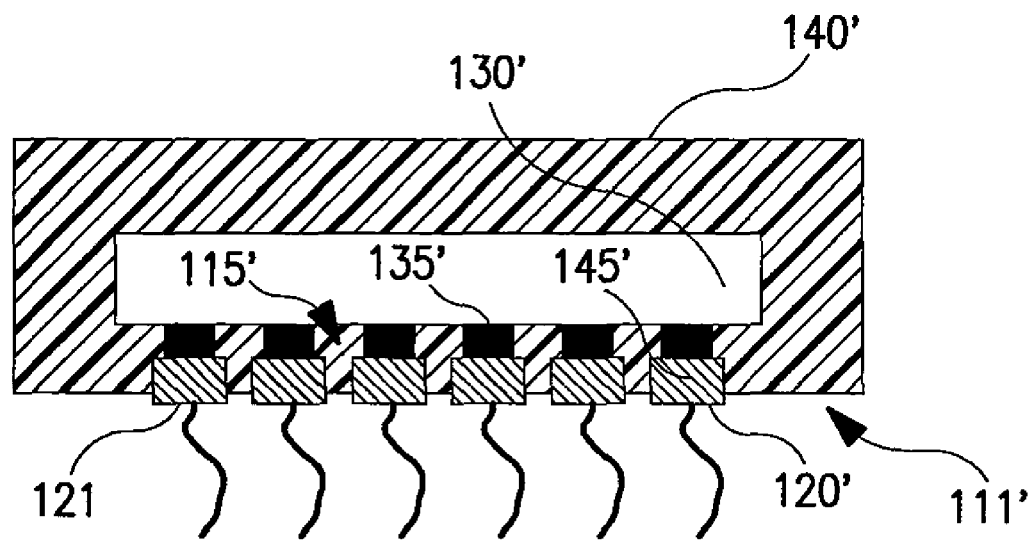
FIGS. 25a and 25b show an optional further embodiment of the present invention comprising wire bonding of the lead frame packages of the present invention to the next level of packaging. These Figures illustrate the packages of FIGS. 24a and 24b being ultrasonically bonded with aluminum wires (shown in FIG. 25a) or with copper wire ball bonding techniques (shown in FIG. 25b). The copper wire ball bonding techniques can be used to connect flip-chips packages to lead frames.
Figure 25B:
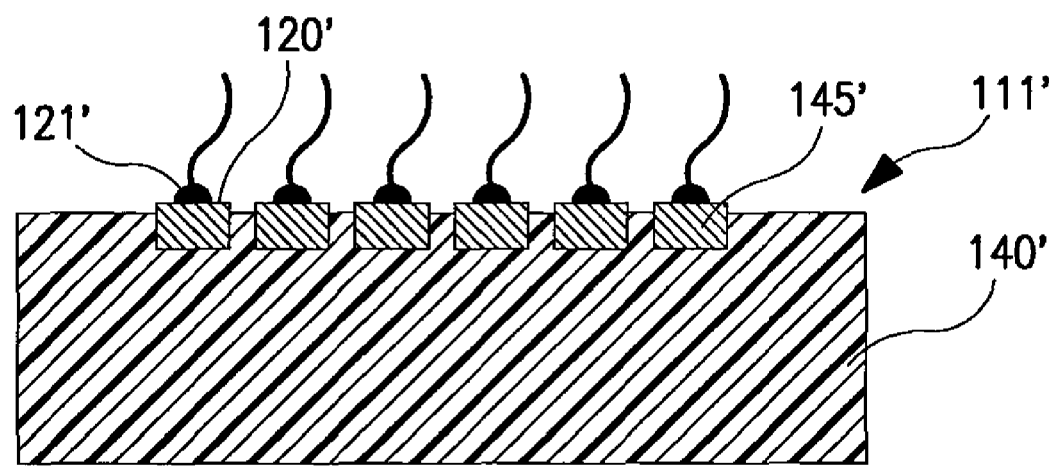

Because the partial etching method of forming any one of the ELP, ELPF or ELGA packages provides robustness during the various manufacturing steps, other forms of electronic packages are also possible. One such form comprises wire bonding of the lead frame packages of the present invention to the next level of packaging. Ultrasonic bonding techniques cannot be used on conventional lead frames because of the fragility of the leads themselves, unless they are attached to a solid base to provide stability and strength. In contrast, the partially etched lead frames are stable by virtue of their webbed structure. The un-etched and pre-plated bottom surface (120') of partially patterned lead frame provides solid bonding areas, or posts, to effectively apply ultrasonic energy for aluminum wire wedge bonding on blocks or strips of ELPs, or ELPFs. In accordance with another aspect of the present invention, therefore, aluminum wires (121) are ultrasonically attached to the bottom surface of a block or strip of partially etched lead frames as shown in FIG. 25a. The wire diameters range between about 0.001 inch to 0.020 inch, the latter diameter representing ribbons instead of wires. The strips are then encapsulated, back-patterned and singulated to form the individual near-CSPs. Ultrasonic bonding is desirable because it avoids exposure to ball bonding temperatures experienced by ball grid array type packages, and hence, improved reliability. Copper wire ball bonding may also be applied as shown in FIG. 25b. It will be understood that the CSPs shown in FIGS. 25a and 25b can be any one of ELPs and ELPFs.

The invention promotes a number of additional advantages in the manufacturing process for electronic packages. For example, after the back etching and prior to singulation, a block of packages will inherently be ready for strip testing while the packages are still arranged in the block. This provides a significant advantage as compared to handling the packages as individual units. Strip testing the packages while they are arranged in a block improves the reliability of the test.

The invention also enables a manufacturer to produce packages having dual or triple rows of staggered leads that can multiply I/O capacity of a given package. The flat continuous bottom surface of the lead frames enables the use of universal assembly equipment, which does not need refitting for each application, and which is completely flexible for automation. For example, processing between 2×2 through 12×12 package blocks does not require any mechanical change. In addition, the invention easily facilitates the construction of packages having a "stand off" for each foot (for example, at 2 mils between the bottom of the molded body at the surface of the foot). The stand off provides additional advantages when the chip packages are to be connected to the next level of packaging, such as a board.

FIGS. 26a and 26b illustrate an embodiment of an aspect of the invention wherein two chips (505, 510) are die-stacked on a chip pad (515) of a lead frame (500). The lower chip (505), that is, the chip affixed to the chip pad receiving area (515), is electrically connected to the inner set (520) of electrical leads surrounding the chip pad area (515). The upper chip (510), the chip affixed to the top of the lower chip (505), is electrically connected to the outermost set (525) of leads surrounding the chip pad area (515). The chips are encapsulated with an encapsulate (530) which protects the chips and wires from damage. Although the chips (505, 510) in FIGS. 26a and 26b are wire-bonded chips, consistent with the invention, one or more of the chips may also be flip-chips. The lower die-stacked chip (505) is larger in size than the upper chip (510). Although the lower and upper chips are not electrically connected to each other in the illustration, in certain embodiments, these chips may be electrically connected, for example, by wires going from one chip to another. The step of forming electrical connections may be accomplished by connecting the terminals of the various chips to the end portions of the electrical leads which extend from the lead frame.

Figure 27B:
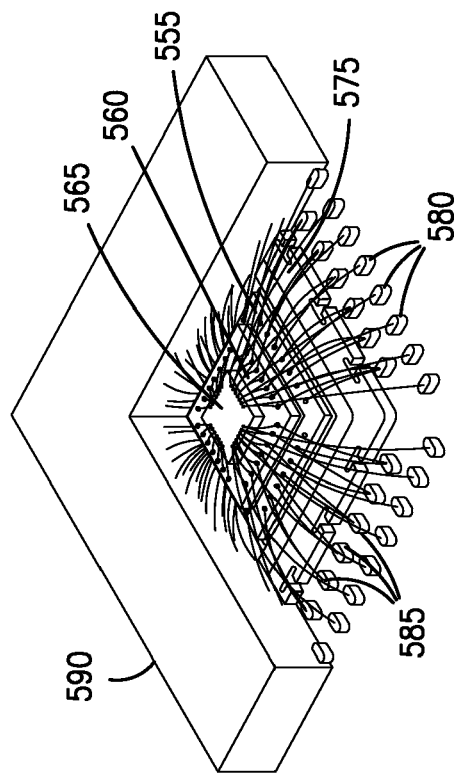
FIGS. 27a-27c are perspective and cross-sectional views of an embodiment of the invention wherein the chip pad is recessed to allow for improved die stacking and for a reduction in the package height.
Figure 27C:
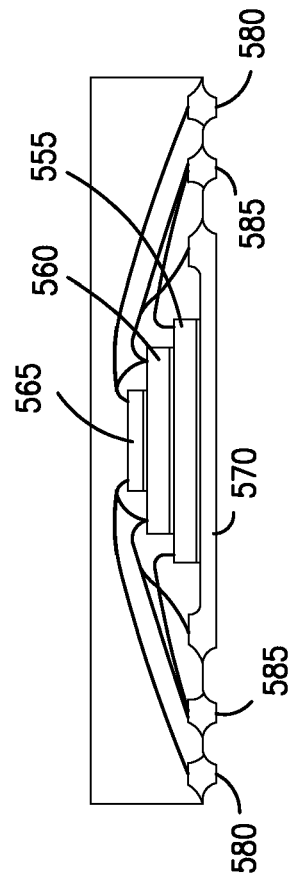
Figure 27A:
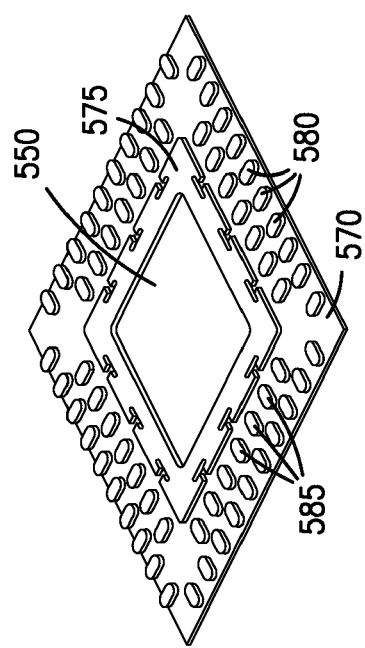
Figure 30D:
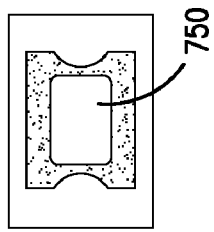
FIGS. 30a-30d illustrate top and side views of several types of electrical leads having alterations according to several embodiments of an aspect of the present invention.
Figure 30C:
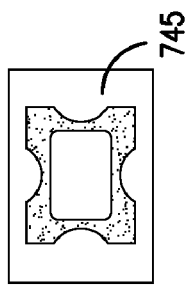
Figure 30B:
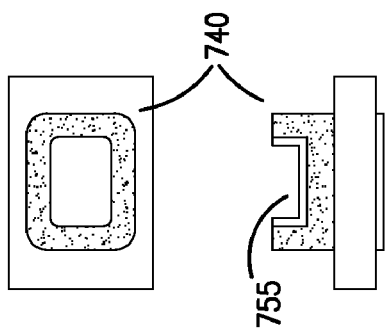
Figure 30A:
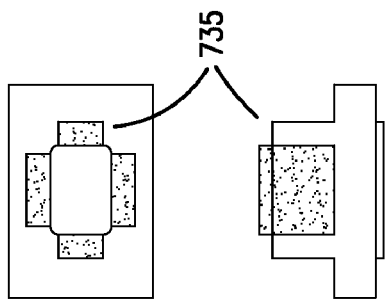

FIGS. 27a-27c illustrate an embodiment of the invention wherein the chip pad area (550) is recessed to allow for improved die stacking and for a reduction in the package height. In FIGS. 27a-27c, three chips (555, 560, 565) are die-stacked to form a chip package. As can be seen in FIG. 27a, the interior of the chip pad area (550) has been removed so that there is only a square outer ring. A chip (555) is placed in and attached to this chip pad area. Although three die-stacked chips (555, 560, 565) are shown in FIGS. 27a-27c, consistent with the invention, there may be any number of die-stacked chips. In FIG. 27a, the interior of the recessed chip pad area (550) is shown as being the top surface of the lead frame. That is, only the outer square ring (575) of the chip pad area has been deposited on top of the lead frame, and the entire interior (550) of the chip pad area was either not deposited or was removed from the lead frame. In alternative embodiments of the invention, a thin layer of material is deposited in the interior of the chip pad area, or a portion of the chip pad interior area is removed. In such embodiments, the interior of the chip pad area will be higher than the lead frame backing, but still lower than the outer portion of the chip pad area, thereby providing the recessed chip pad area for attachment of a chip.

Although in FIGS. 27a-27c, the largest chip (555) is located at the bottom of the die-stack, and the smallest chip (565) is located at the top, the chips may be positioned such that the largest is at the top and the smallest is on the bottom. The topmost chip (565) is shown as being connected to the middle chip (560) and to the electrical leads (580, 585) on the lead frame (570). The middle chip (560) is shown as being connected to the topmost chip (565) and to the electrical leads on the lead frame. The encapsulate (590) covering the die-stacked chips (555, 560, 565) prevents the wires of the chip package from being damaged during manipulation or installation. The various chips are attached to the lead frame (550) or each other using an adhesive, such as a conductive or a non-conductive epoxy, or using an insulating material.

FIGS. 28a and 28b are perspective views of lead frames embodying several aspects of the invention. FIG. 28a shows a lead frame (600) with four chip pad areas (605, 610, 615, 620) before chips are attached to the lead frame. FIG. 28b shows the same lead frame (600) after chips (625, 630, 635, 640) have been attached to the chip pad areas (605, 610, 615, 620) and electrically connected to the lead frame.

FIG. 28a shows the lead frame (600) as having three chip pad areas (610, 615, 620) for wire-bonded chips and one chip pad area (605) for a flip-chip. Two of the three chip pad areas (615, 620) for wire-bonded chips are not recessed and the remaining chip pad area (610) is recessed. These chip pad areas (610, 615, 620) comprise alterations (645) in the form of locking areas shaped as a "T" on the outer perimeter of the chip pad area. These locking features provide additional surface area for an encapsulate (650) to adhere, and offer a means for retaining the encapsulate without sideways movement of the encapsulate.

In FIG. 28b, the chip pads areas (615, 620) which are not recessed each support a single chip (635, 640) which is connected via electrical leads to the lead frame. The chip pad area (605) for the flip chip (625) is formed by a bed of electrical leads, and a flip-chip (625) is placed on top of these leads to form the electrical connections. The flip-chips (625) thereby save space on the lead frame (600) as compared to wire-bonded chips (630, 635, 640). Although for clarity only single chips are shown to be attached to the two non-recessed chip pad areas (615, 620) on the lead frame, in other embodiments of the invention, there may be one or more chips placed on top of such wire-bonded chips or flip-chips.

In FIG. 28b, the recessed chip pad area (610) on the lead frame supports a plurality of die-stacked wire-bonded chips (collectively 630). These chips are attached to the chip pad area (610) using an adhesive, such as a conductive or non-conductive adhesive, for example, an epoxy, or using an insulating layer. The outer periphery of the recessed chip pad area (610) comprises alterations (645) in the form of locking areas shaped as a "T".

The lead frame (600) in FIGS. 28a and 28b also has electrical leads (generally 655) located between the flip-chip chip pad area (605) and the recessed chip pad area (610) which may be used for other elements besides computer chips. For example, these electrical leads can be elements such as semiconductor elements, passive components, resistors, and capacitors, or other non-chip components [shown generically as (660)] which serve to supplement the functions of the chips in the chip package. In FIG. 28b, capacitors or resistors are attached to these electrical leads.

The chips can be die-stacked one by one on the chip pad area and then electrically connected to the lead frame before the next chip is die-stacked and electrically connected. Alternatively, all the chips can be die-stacked and then the entire die-stacked set of chips can be electrically connected to the lead frame. In another embodiment, the chips may be die-stacked separately from the chip pad area, and then the entire die-stacked set of chips may be attached and electrically connected to the lead frame.

FIGS. 29a-29c show embodiments of various types of alterations which may be applied to the chip pad area. In FIG. 29a, the alterations (705) take the form of notches in the shape of a "T" on the outside edge of the chip pad area (720). In FIG. 29b, the alterations (710) are in the form of cavities or perforations located along the outer perimeter of the chip pad area (725). FIG. 29c illustrates alterations (715) in the form of notches along the outer perimeter of the chip pad area (730). These alterations provide increased strength and an improved stability to the encapsulated chip package.

Although the alterations or locking features (705, 710, 715) in FIGS. 29a-29c are located on the periphery of the respective chip pad areas (720, 725, 730), the alterations may also be placed on other portions of the chip pad area. For example, the alterations may be on interior portions of the chip pad area which will not be covered by a chip and therefore can be filled with an encapsulate.

In FIGS. 29a-29c, the alterations have been shown as being located on the chip pad area. In additional embodiments of the invention, such as those illustrated in FIGS. 30a-32f, the alterations may be located on the electrical leads located on the lead frame, and to which the chips may be electrically connected. The alterations may also be placed on both the chip pad area and the leads concurrently.

Figure 31B:
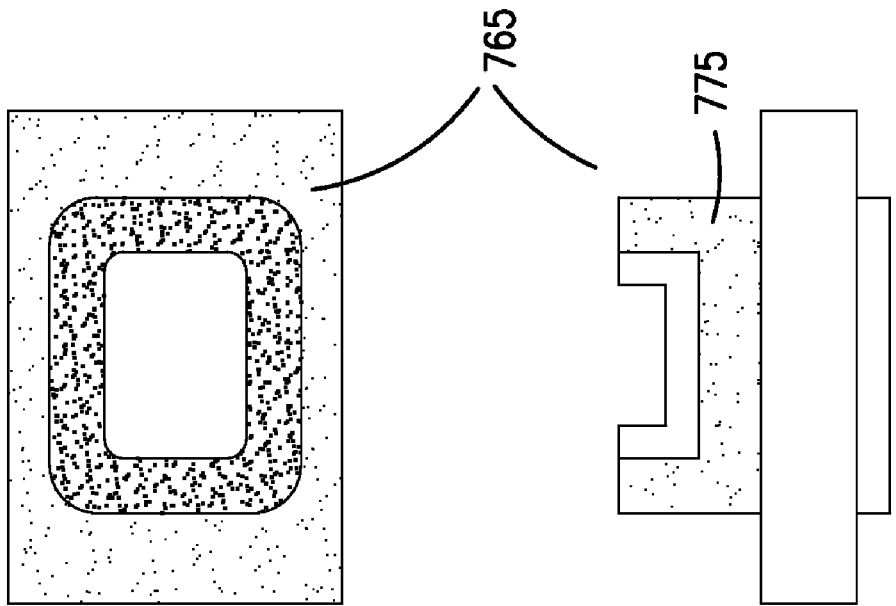
FIGS. 31a-31b illustrate top and side views of electrical leads according to another embodiment of the present invention, in which the surfaces of the lead frames or leads have been roughened.
Figure 31A:
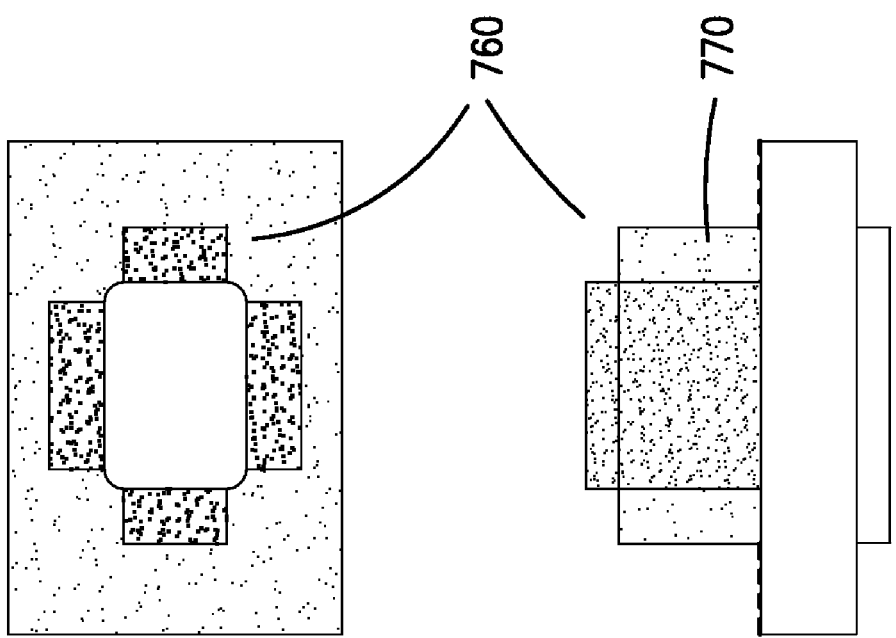

FIGS. 30a-31b show top and side view of several embodiments of electrical leads having alterations. FIGS. 30a-30d illustrate various types of leads (735, 740, 745, 750) and cross-sections of some of these leads. FIG. 30b shows that an alteration may have a bondable material located in an inner surface (755) of the lead (740). FIGS. 31a and 31b shows that the surfaces (770, 775) of the leads (760, 765) may be roughened for improved retention of an encapsulate.

Figure 32A:
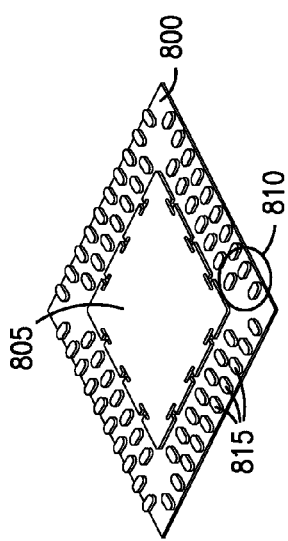
FIGS. 32a-32e illustrate perspective views of several types of alterations provided on electrical leads in accordance with another aspect of the present invention.
Figure 32D:
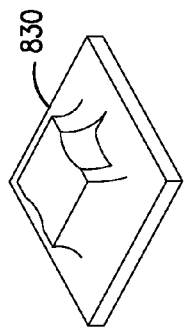
Figure 32C:
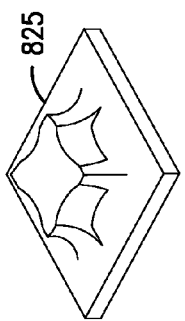
Figure 32B:
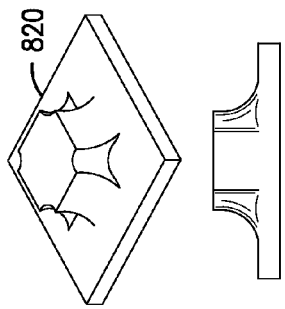
Figure 32F:
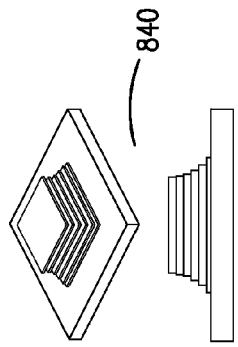
FIG. 32f illustrates top and side views of an electrical lead according to an embodiment of another aspect of the invention, in which the surfaces of the lead frames have been roughened to provide for improved adhesion of an encapsulate. This surface roughening can be done in combination with the alterations presented in the present invention.
Figure 32E:
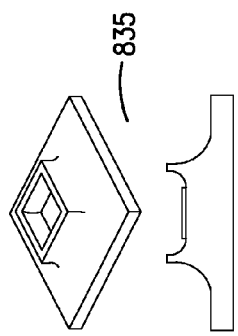

FIGS. 32a-32f illustrate perspective views of the embodiments of FIGS. 30a-31b and exemplifying several embodiments of electrical leads having alterations. FIG. 32a illustrates a lead frame (800) having a chip pad area (805). The circled portion (810) of the Figure illustrates electrical leads (815) which have alterations. FIGS. 32b-32f exemplify these types of leads. FIGS. 32b-32d show embodiments of leads (820, 825, 830) generally similar to those illustrated in FIGS. 30a, 30c, and 30d. FIG. 32e illustrates a lead (835) which is generally similar to that shown in FIG. 30b. FIG. 32f illustrates a lead (840) having surface roughening in the form of horizontal notches along the periphery of the lead, thereby giving the lead a stepped appearance. A chemical or another type of process can be used to obtain the surface roughening shown in FIG. 32f. This surface roughening can be applied in combination with the lead and chip pad alterations.

FIGS. 33a-33b illustrate cross-sectional views of an aspect of a further embodiment of the invention wherein a clip (925) is used in place of wire bonding to provide power to the chip scale package (935) and thereby improve its power capability. FIG. 33a illustrates this embodiment with the use of wire-bonded chips (905 and 910), and FIG. 33b illustrates the embodiment for flip-chips (shown as a single chip 907). The clip provides a substantially greater amount of power compared to wire bonding and consequently allows for an improved reliability of the resultant chip package (935). The clip also assists in dissipating heat from the chips. When the clip is used, the topmost chip [e.g. (910) in FIG. 33a] will contain leads for transmission of electrical signals to the printed circuit board.

In FIG. 33a, the wire-bonded chips (905 and 910) are placed on the chip pad area (900) and electrically connected to leads (915) via wires (920). A plurality of wires (920) are used to connecting the chip (910) to a plurality of rows of the electrical leads (915), although the number and type of electrical connections will depend on the specific embodiment. In FIG. 33b, a flip-chip (907) is placed on electrical leads (such as 915) which project from a lead frame. For ease of illustration, only a single flip-chip (907) is illustrated in FIG. 33b, although in practice there can be any combination of flip-chips and wire-bonded chips forming the chip scale package (935).

The top surface of the uppermost chips (907 and 910) are electrically connected one or more electrical leads (917) on the lead frame (900) by a clip (925). The clips (925) are bonded to the tops of the chips after the chips have been attached to the lead frames. Any convenient means can be used to bond the clips to the chips. In the examples illustrated in FIGS. 33a-33b, an electrically conductive paste or solder (930) is used to affix the clip (925) to the chips (907 and 910). The clips (925) can be manufactured from any conductive substance, such as a metal or a metal alloy. Examples of suitable conductive substances include copper and silver. Depending upon the specific embodiment, individual clips can be affixed to particular chips, or an entire conductive strip or panel can be affixed to a plurality of chips using a gang method. In this latter embodiment, the act of singulation cuts through the conductive strip or panel to effectively obtain the individual chip packages.

The stacked chips are subsequently covered by an encapsulate and after singulation yield chip scale packages (935) in accordance with the present invention.

Exposed die pads are typically used to provide a thermal and electrical separation between a chip scale package and a printed circuit board (PCB). However, in certain instances, exposed die pads or chip pad areas are detrimental to the proper function of a chip or chip scale package. For example, some printed circuit board designs have active circuits underneath the chip scale package, and these circuits can malfunction if the package has an exposed chip pad. Although the use of a QFN (quad flat no-leads) package in these situations can present a possible solution, lead frames designed to use QFN packages have a number of associated assembly difficulties. For example, it is difficult or impossible to produce QFN packages for pad-less lead frames using existing technologies, that is, (a) with tape, in which the lead frame is commonly in the map (mold array process) format, or (b) without tape, in which the lead frame is in the matrix format.

In order to overcome these difficulties, the user would either (a) have the lead frame half-etched from the bottom so that the pad can be embedded during molding; or (b) have an upset on the diepad. However, for taped map lead frames, there are issues with performing wire bonding since the tape will prevent the heater block (used for preheating the lead frame before wire bonding a semiconductor to the lead frame) from having contact with the pad. Taping performed after wirebonding has negative impacts on the production yield. For matrix lead frames, the heater block can be designed with a pedestal to support the chip pad area during wire bonding. However, this lead frame design has a lower capacity, and therefore will affect the units per hour production capacity and increase production costs.

In these circumstances, a pad-less ELP can provide improved functionality and reduced chances of malfunction. The pad-less ELP can maintain a high density design and provide a more robust assembly process. The pad-less ELP embodiment has a generally similar construction as the ELP-chip pad embodiment, but without etching protection on the bottom. Accordingly, the pad-less ELP embodiment does not require drastic changes to the manufacturing line.

The pad-less lead frame has a half-etched die receiving area without a bottom etching mask or plating. The die receiving area is able to house a larger die size than can other lead frames, and can address devices that need the die to be completely isolated. Since the die receiving area is recessed, the resultant chip scale package will have a very low profile, thereby minimizing the height required for its installation. The die attach material (or adhesive) will accordingly be non-conductive to prevent electrical shorting, and will typically be the same color as the mold compound to provide a uniform appearance. In addition, the die attach material or adhesive should be stable during back-etching in order to prevent damage to the chip scale package. The die attach material can be any substance known in the art, such as a curable epoxy resin or a tape such as a polyimide adhesive tape.

Figure 34A:
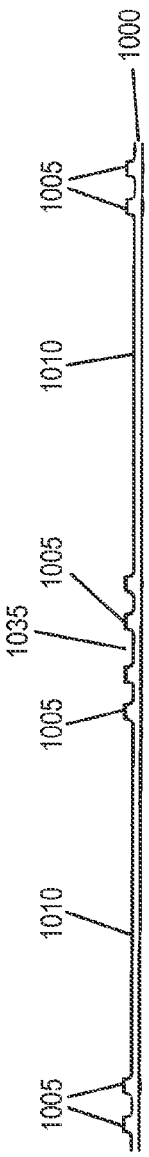
FIGS. 34a-34f illustrate an embodiment of a partially patterned lead frame in which a chip receiving area is absent, and the chip is placed directly on the lead frame. After subsequent die attachment, wire bonding, encapsulation, and back-patterning and finishing steps, the portion of the lead frame under the chip is removed. This finishing step will expose the non-conductive adhesive (such as an epoxy material or a tape) which was used to affix the chip to the lead frame.

FIGS. 34a-34f illustrate an embodiment of a partially patterned lead frame in which a chip pad area or a chip receiving area is absent, and the chip is affixed directly to the bottom of the etched film which will form the lead frame. After die attachment, encapsulation and back-patterning, the bottom of the chip is exposed in the chip scale package. As shown in FIG. 34a, the partially etched film does not have a raised chip pad area to receive a semiconductor chip.

FIG. 34a shows a metal film (1000) which has been partially etched on the front side. The film (1000) may be pre-plated on one or both sides with a substance which will facilitate later processing such as wire-bonding. For example, the top of the film may be pre-plated with a wire-bondable substance such as NiPdAu, or silver (Ag), such as immersion-Ag, and the bottom of the film may be bare or pre-plated with the same or another wire-bondable substance. In other embodiments, an organic material can be used as the etching mask.

The film (1000) is etched on its front surface to prepare the electrical lead portions (1005) to which an integrated circuit chip will later be attached. The film has street areas (1035) separating the portions of the lead frame, and the encapsulated lead frames will be singulated through these street regions (1035) to obtain the individual chip scale packages. Chip mounting areas (1010) are etched into the front surface of the film. These chip mounting areas (1010) are lower in height than the leads. In other words, the film (1000) is etched the least in the area of the leads (1005) and will be etched the most in the other parts of the lead frame.

Figure 34B:

After the film (1000) had been prepared and suitably etched, a semiconductor or integrated circuit chip (1020) will be die attached to the film, as illustrated in FIG. 34b. The chip (1020) can be attached using any convenient substance, die attach material, or adhesive (1015), which will normally be non-conductive to avoid propagation of electrical signals.

In one embodiment, the chip (1020) can be attached using a non-conductive epoxy (1015). The adhesive can be applied as a fluid or viscous liquid which will then harden or form internal cross-links to form a strong, durable bond. The adhesive or die-attach material (1015) will be visible and exposed on the bottom of the resultant chip scale package (1040) and therefore will need to have long-term thermal and mechanical stability. In other embodiments, the adhesive can be in the form of a tape, such as a polyimide adhesive tape. The tape typically consists of a base film coated with an adhesive substance such as a thermoplastic polymer on both sides, and the tape may be tacky or tack-free. In further embodiments, the adhesive is a solid plastic substance which cures or solidifies in place to provide strong attachment between the chip and the lead frame. Various kinds of adhesives, tapes, and other die attach materials are known and available commercially.

In one embodiment, the adhesive (1015) and the surrounding encapsulate (1030) are both black, thereby presenting a uniform coloration to the completed chip scale package (1040). In other embodiments, the adhesive and encapsulate are different colors. In further embodiments, a manufacturer may wish to choose specific complementary or contrasting colors for the adhesive and the encapsulate, for example, to provide a particular trade dress.

The thickness of the adhesive (1015) is not critical, although it will have to be sufficiently thick to have mechanical stability and to withstand back-etching of the lead frame. The adhesive (1015) will typically cover the entire bottom surface of the integrated circuit chip (1020) to avoid chemical or mechanical damage to the chip during subsequent back-etching or back-patterning procedures.

Figure 34C:
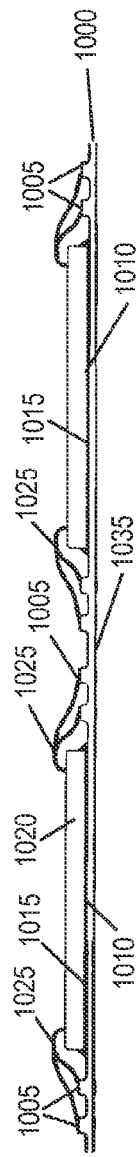
Figure 34D:
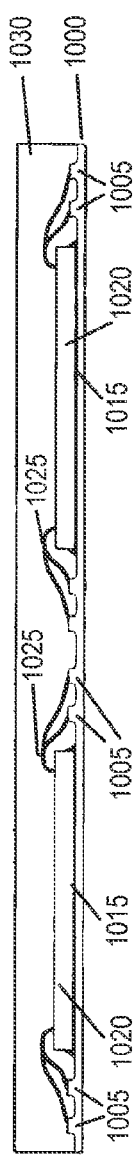

Once the chip (1020) has been die attached to the film (1000), the chip is connected to the electrical leads (1005), for example, using lead wires (1025), as illustrated in FIG. 34c. The chip (1020) and wire leads (1025) are hermetically sealed (FIG. 34d) using an encapsulate (1030). As discussed above, the encapsulate (1030) can be any substance known in the art. A non-limiting list of common encapsulates used in the industry include silica particulate-filled epoxy resins and liquid epoxy resins. The encapsulate is typically applied as a liquid or viscous liquid to the various elements which are mounted on or affixed to the lead frame. Curing the encapsulate yields a tough, durable coating which protects the underlying elements in the chip scale packages from damage.

Figure 34E:
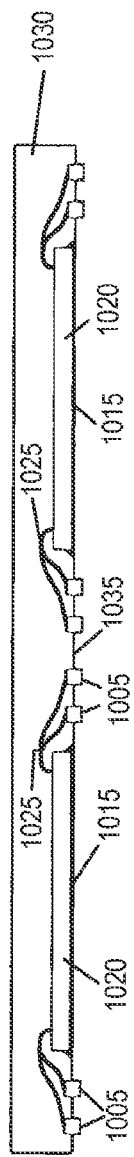
Figure 34F:
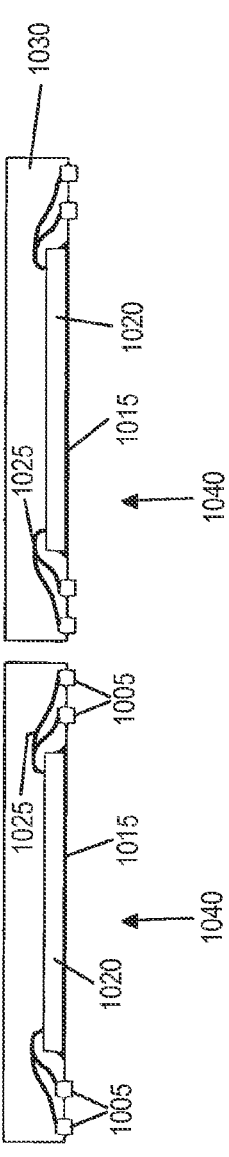

After the encapsulate (1030) has cured, the lead frame (1000) is then back-etched to isolate the electrical leads (1005), as illustrated in FIG. 34e. The portions of the lead frame (1000) underlying the chips (1020), that is, the original chip mounting areas, are substantially or completely removed during back-etching, up to the chip adhesive (1015).

The lead frames are then singulated along the street portions (1035) to yield individual encapsulated chip scale packages (1040) suitable for subsequent applications, such as for attachment to computer circuit boards. A manufacturer may choose to print or screen a logo, lot number, or other kind of indicia on the finished chip scale package for identification purposes.

FIGS. 35 and 36a illustrate bottom and cross-sectional views, respectively, of the chip scale package (1040) prepared via the sequence shown in FIGS. 34a-34f. In FIG. 35, the cured adhesive (1015) is shown in the center of the chip scale package (1040) as a lighter-colored irregular square. Surrounding the cured adhesive substance (1015) is the encapsulate (1030), shown in a darker color. The encapsulate (1030) covers and envelopes the integrated circuit chip (1020), wires (1025), leads (1005), and any other components that may be affixed to or mounted on the lead frame.

FIG. 36b illustrates another embodiment of the invention, wherein a plurality of integrated circuit chips (1020, 1050) are die-stacked in a finished padless chip scale package (1070). Although both FIGS. 26b and 36b show embodiments of the invention having die-stacked chips, the embodiment in FIG. 26b has a chip pad (515) and the embodiment in FIG. 36b employs the padless technique. Comparison of FIGS. 26b and 36b shows that the absence of the chip pad reduces the height of the resultant chip scale package, thereby allowing preparation of chip scale packages having a lower profile.

The embodiment illustrated in FIG. 36b can be prepared using the inventive disclosed methods. In brief, the first, lower chip (1020) is placed on a partially patterned lead frame (not illustrated in this Figure) which does not have a chip pad, and the chip (1020) is affixed to the lead frame using an die-attach material (1015), such as an adhesive or an epoxy. The upper chip (1050) is then placed on top of and affixed to the lower chip (1020) using an adhesive substance (1045) such as a conductive or non-conductive epoxy, or an insulating material. The chips (1020, 1050) are electrically connected to the lead frame using wire bonding.

The electrical connections (1025) can be made sequentially after each chip is placed on the lead frame. That is, the first chip (1020) can be placed on and electrically connected to the lead frame, and then the second chip (1050) can be placed on the first chip (1020) and electrically connected to the lead frame. In other embodiments, the chips (1020, 1050)

are first die-stacked in position, and then the electrical connections (1025) are made. Various combinations of these stacking and electrically connecting steps are possible and within the scope of the present invention.

After the chips (1020, 1050) are die stacked and electrically connected (1025) to the lead frame, the lead frames are then encapsulated with an encapsulate (1030) to permanently mount the chips and electrical wires to the lead frame. The backs of the lead frames are then back-patterned, etched, and finished as appropriate to isolate the electrical leads (1005). During this back-patterning process, the portions of the lead frame underneath the die-stacked chips are completely removed, and only the leads (1005) "protrude" from the finished chip scale packages. Generally, the only portion of the original lead frames which would remain after back-patterning is the electrical leads (1005). Finally, the chip scale packages are singulated in the street regions to yield the individual chip scale packages (1070) for subsequent applications.

Figure 37A:
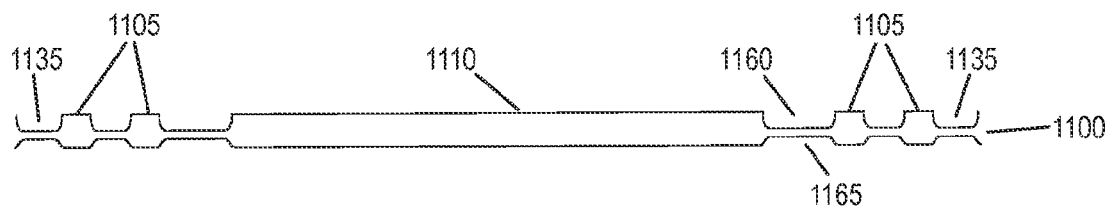
FIG. 37a illustrates a lead frame in which both the top and bottom surfaces have been partially patterned before any chips are attached to the lead frame.

According to another aspect of the invention, both the top and bottom surfaces of the lead frame may be partially patterned or partially etched prior to die attachment. As illustrated in FIG. 37a, the lead frame (1100) may be etched on both sides before assembly of the chip scale package. The etching on both sides of the lead frame may be of uniform depth. Alternatively, the etching may be uneven and one side may be patterned deeper than the other side. For example, the top may be patterned deeper (e.g. area 1160) than the bottom (e.g. area 1165).

The double-sided etching permits a reduced thickness for the portions of the film of the lead frame which will ultimately be removed. Consequently, etching will proceed faster and thereby increase the production speed and reduce costs. The partial patterning can reduce the thickness of the etched portions of the film by any convenient amount. For example, the partially patterned segments of the lead frame may remove between 25-90% of the original film thickness in the etched areas.

The lead frame material may be pre-patterned with a resist material. The resist can be a metal or a non-metal, such as an organic resist, and can be oven-cured or UV-cured. Such pre-patterning process are known in the art.

Instead of pre-plating the lead frame with a metal, the lead frame may be printed with a printable ink, such as an epoxy ink or a stenciling ink, or an organic material, such as a polyimide resin, as an etching mask before back-etching. The printable ink or This technique advantageously allows for cost reductions and streamlines manufacturing. From a materials standpoint, the use of a printable ink or an organic substance as an etching mask allows the manufacturer to source the lead frames from many manufacturers since not all suppliers can pre-plate lead frames on both sides. In such an instance, the lead frame supplier will only etch and plate the lead frame on the top, leaving the bottom unfinished. For example, the bottom of the lead frame may be bare metal such as copper. Masking with a printable ink or an organic substance is typically less costly than masking with a precious metal such as palladium, gold, platinum, rhodium, silver, or ruthenium, or alloys thereof, examples of substances which have been used for pre-plating lead frames. In addition, removing the ink after etching is typically easier than removing the precious metal.

The lead frame may also be pre-plated prior to etching. The pre-plating material may be the same or different on the top and bottom surfaces of the lead frame. Examples of suitable pre-plating materials include wire-bondable materials such as Ni/Pd/Au-strike and silver (Ag), and solderable materials such as Sn/Pb, lead-free solder, immersion-tin electroless nickel, or Au (gold) strike. In an embodiment of the invention, the front surface is pre-plated with a bondable material and the back surface is pre-plated with a solderable material. In another embodiment, the front surface may be pre-plated with a wire-bondable material, and the back surface may be pre-plated and overlaid with a resist. In further embodiments, an organic material can be printed or applied onto the lead frame for use as a photoresist.

FIG. 36a shows a film (1100) which has been etched to form a chip pad (1110) and a plurality of electrical leads (1105). The top of the film has been etched to a greater extent [as exemplified by (1160)] than the bottom of the film [as exemplified by (1165)]. FIG. 36b shows a chip (1120) electrically connected via wire bonding (1125) to the lead frame shown in FIG. 36a. In FIG. 36b, an integrated circuit chip (1120) has been affixed to the lead frame (1100) using an adhesive (1115), and the chip package has been covered with an epoxy encapsulate (1130). Street regions (1135) separate the electrically connected and encapsulated chips (1120).

After chips (1120) have been affixed to the chip pads (1110) of the lead frames and encapsulated, the back surface of the lead frames may be back-patterned and etched to isolate the electrical leads (1105) and chip pad (1110), or to otherwise electrically separate the various portions of the lead frames to create the desired features. As the back surfaces have already been partially etched, this back-etching process will proceed more rapidly and thereby advantageously improving the units per hour (UPU) capacity and lowering costs.

Figure 37B:
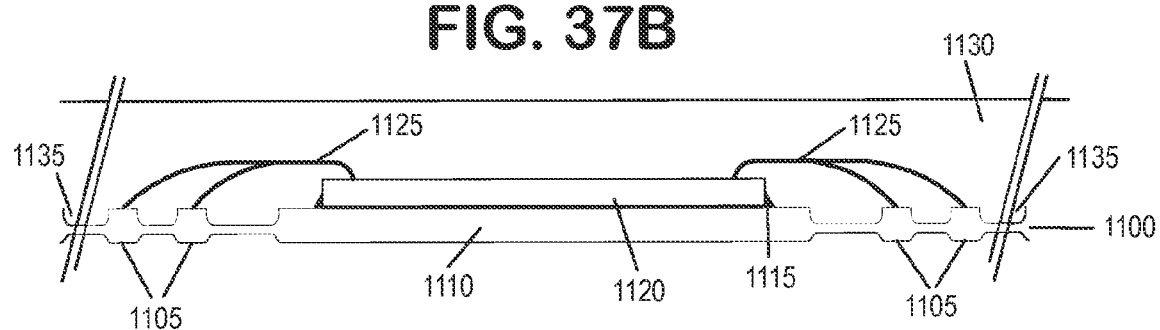
FIG. 37b illustrates the lead frame of FIG. 37a to which a chip had been electrically connected, and which has been encapsulated prior to back-patterning and singulation.

The bottom die pads of prior lead frames are generally planar. An example of a lead frame having a planar bottom die pad is illustrated in FIG. 37b. However, in certain instances, these planar die pads are prone to lead to solder voiding issues when mounting the chip scale packages to printed circuit boards. Without being bound by theory, it is believed that solder voiding is a phenomenon primarily caused by outgassing of encapsulated solvents. Although solder voiding reduces the effectiveness of the electrical contacts and thus can cause second-level reliability issues, solder voiding can generally only be detected by X-ray microscopy or destructive micro-sectioning.

Figure 38:
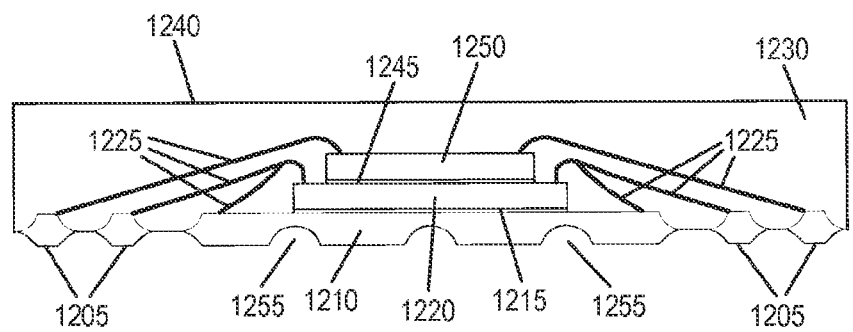
FIG. 38 illustrates a chip scale package comprising a plurality of die-stacked wire-bonded chips in which the bottom of the die pad has been hatched to provide air ventilation.

According to another aspect of the invention, a lead frame may have a hatched bottom die pad. An embodiment of such a die pad is shown in FIG. 38. The hatching (1255) may form a channel across the die pad (1210) and reduce the surface area of contact between the die pad and the printed surface board, thereby advantageously reducing the amount of solder voiding. The hatchings or channels (1255) acts as air vents so that there is no trapped air during reflow.

The hatched bottom pad (1210) is obtained by making a small array of plating masks underneath the pad on the bottom side of the lead frame. During etching, this array of plating masks will create the half-etched channels across the bottom die pad. The mask will function as a resist during the etching process.

The etching mask can be a nickel/palladium/gold composite (NiPdAu), silver (Ag), antimony (Sn), nickel (Ni), or mixtures thereof, or any non-metallic or organic material or ink that can be applied or printed onto the lead frame. The etching mask may be oven- or UV-cured, as appropriate. Other suitable masks and photoresist substances are known to those of skill in the art. The processes of masking and etching can be performed as previously discussed.

FIG. 38 shows a chip scale package (1240) having a hatched bottom die pad (1210) to which are mounted a plurality of integrated circuit chips (1220, 1250). The lower chip (1220) is affixed to the hatched die pad via an adhesive (1215), and the upper chip (1250) is affixed to the lower chip (1220) via an adhesive (1245). The chips (1220, 1250) are electrically connected to the electrical leads (1205) via wire bonding (1225), although in other embodiments, the chips (1220, 1250) may also be electrically connected to each other. The chips are encapsulated with an encapsulate (1230), which may be an epoxy resin or another substance.

Although FIG. 38 shows a chip scale package comprising two die-stacked integrated circuit chips, in other embodiments of the invention, there may be only a single chip, while in further embodiments, there may be three or more die-stacked chips. All such embodiments are within the scope of the present invention. There may also be differing numbers of chips affixed to the various chip pads on the lead frame. For example, one chip pad of a lead frame may have a single die-mounted chip, while another chip pad on the same lead frame may three die-mounted chips. Accordingly, the invention may be used to prepare a number of different and non-identical chips on a single lead frame.

The various described embodiments of the invention are not mutually exclusive and can optionally be combined to prepare variations of the disclosed lead frames. For example, the bottom of the die pad of the unevenly-etched lead frame illustrated in FIG. 37a may be cross-hatched and used to prepare the chip scale package illustrated in FIG. 38 having the bottom channels. Other variations are possible and within the scope of the present invention.

While the invention has been particularly shown and described with reference to particular embodiments, those skilled in the art will understand that various changes in form and details may be made without departing from the spirit and scope of the invention.

What is claimed is:

1. A method of forming chip scale packages, the method comprising the steps of:
    forming a block of partially etched lead frames, the lead frames comprising webbed portions, a chip mounting area, a plurality of electrical lead portions, and street portions,
    attaching an integrated circuit chip to the chip mounting area of the first region of the film;
    forming electrical connections between one or more terminals on the chip and one or more electrical lead portions on the lead frame;
    encapsulating the lead frame by applying an encapsulant material over the lead frames and street portions;
    back-patterning the bottom surface of the lead frames to remove the webbed portions, street portions, and the chip mounting area, whereby all or a substantial portion of the lead frame underlying the integrated circuit chip is removed; and
    singulating the encapsulant material disposed over the street portions of the lead frame to form individual chip scale packages.

2. The method according to claim 1, wherein the lead frames are selectively pre-plated with a pre-plating material or masked with a masking material on their top side, bottom side, or both, prior to encapsulation.

3. The method according to claim 2, wherein the lead frames are selectively pre-plated using Ni/Pd/Au-strike, immersion-Ag, Sn/Pb, lead-free solder, immersion-tin electroless nickel, silver (Ag), or Au (gold) strike.

4. The method according to claim 2, wherein the lead frames are selectively masked using a printable ink, a stenciling ink, an epoxy ink, or an organic substance.

5. The method according to claim 2, wherein pre-plating material or the masking material is removed from the bottom of the lead frames after back-patterning.

6. The method according to claim 1, wherein the lead frame comprises a film of copper or a copper alloy.

7. The method according to claim 1, wherein the integrated circuit chip is attached to the chip mounting area using an adhesive.

8. The method according to claim 7, wherein the adhesive is a resin, an epoxy resin, a solder paste, or a tape.

9. The method according to claim 1, wherein the lead frames are formed by chemical etching, stamping, or coining.

10. The method according to claim 1, wherein the chips are electrically connected to the lead frames using wire bonding.

11. The method according to claim 1, further comprising:
    die-stacking one or more second chips onto the tops of the integrated circuit chips affixed to the lead frame; and
    electrically connecting the one or more second chips to the lead frame, the integrated circuit chips affixed to the lead frame, or both.

12. A partially patterned lead frame manufactured in accordance with claim 1, the lead frame for use in the manufacture of an electronic package, the lead frame comprising:
    a film having a top surface and a bottom surface;
    the top surface of the film having (a) a first region partially patterned from the top surface but not entirely through to the bottom surface, and (b) a second region not partially patterned from the top surface, the second region forming a chip pad area for supporting an integrated circuit (IC) chip and a plurality of electrical leads for providing electrical connections to the IC chip, the chip pad area and plurality of electrical leads connected via the first region but not connected through the top surface; and
    the bottom surface of the film being partially patterned from the bottom surface but not entirely through to the top surface.

13. The method according to claim 1, wherein the top and bottom surfaces are patterned in a complementary pattern.

14. The method according to claim 1, wherein the bottom surface of the lead frame is patterned with hatchings, channels, or both.

15. The method according to claim 1, wherein the patterning on the top surface is deeper than the patterning on the bottom surface.

16. A method for forming chip scale packages, the method comprising:
    providing a partially patterned lead frame, the lead frame having (a) a first region partially patterned from the top surface but not entirely through to the bottom surface, and (b) a second region not partially patterned from the top surface, the second region forming a chip pad area for supporting an integrated circuit (IC) chip and a plurality of electrical leads for providing electrical connections to the IC chip, the chip pad area and plurality of electrical leads connected via the first region but not connected through the top surface;
    attaching an integrated circuit chip to the chip pad area of the first region of the lead frame;
    forming electrical connections between one or more terminals on the chip and one or more electrical lead portions on the lead frame;
    encapsulating the lead frame by applying an encapsulant material over the lead frames and street portions;
    back-patterning the bottom surface of the lead frames to remove the webbed portions and street portions, and removing a portion of the bottom surface of the chip pad area to form one or more channels therethrough; and singulating the encapsulant material disposed over the street portions of the lead frame to form individual chip scale packages.

17. The method according to claim 16, wherein the one or more channels of the chip pad area extend across the length of entire chip pad area.

18. The method according to claim 17, wherein the one or more channels function as air vents.

19. The method according to claim 16, wherein the one or more channels are in the form of hatchings.

* * * * *